(12) United States Patent
Nishi et al.

(10) Patent No.: US 12,096,678 B2
(45) Date of Patent: Sep. 17, 2024

(54) FILM FORMING APPARATUS INCLUDING A SPRAYER PORT AND EXHAUST PORT ON A SUPPLY PIPE

(71) Applicant: NIKON CORPORATION, Tokyo (JP)

(72) Inventors: Yasutaka Nishi, Tokyo (JP); Makoto Nakazumi, Yamato (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/283,672

(22) Filed: Oct. 3, 2016

(65) Prior Publication Data

US 2017/0025644 A1 Jan. 26, 2017

Related U.S. Application Data

(63) Continuation of application No. PCT/JP2015/061898, filed on Apr. 17, 2015.

(30) Foreign Application Priority Data

Apr. 18, 2014 (JP) .................. 2014-086033

(51) Int. Cl.
*B05B 13/02* (2006.01)
*B05B 7/08* (2006.01)
(Continued)

(52) U.S. Cl.
CPC ........... *H10K 71/00* (2023.02); *B05B 7/0869* (2013.01); *B05B 13/0221* (2013.01);
(Continued)

(58) Field of Classification Search
CPC ..... B05D 1/005; B05C 11/1039; B05B 3/105; B05B 3/1057; B05B 7/0458; B05B 7/08;
(Continued)

(56) References Cited

U.S. PATENT DOCUMENTS 2,297,607 A * 9/1942 Blackburn ............. H01G 9/048
156/305
2,994,618 A * 8/1961 Landgraf .................. B05B 5/14
427/482
(Continued)

FOREIGN PATENT DOCUMENTS

JP 2001-261373 9/2001
JP 2002-75641 3/2002
(Continued)

OTHER PUBLICATIONS

International Search Report mailed Jul. 14, 2015 in corresponding International Application No. PCT/JP2015/061898.
(Continued)

*Primary Examiner* — Karl Kurple

(57) ABSTRACT

A film forming apparatus, a substrate processing apparatus, and a device manufacturing method are provided, which improve the film thickness uniformity of a thin film that is formed on a substrate by spraying a thin film material. The film forming apparatus which forms a thin film on a substrate is provided with a nozzle that sprays a thin film material and an exhaust unit that discharges a gas. An exhaust port of the exhaust unit is arranged on a side that is opposite to the direction in which the gravity acts with respect to the substrate. The substrate processing apparatus performs a predetermined process on the substrate using the film forming apparatus. The device manufacturing method manufactures a device using the film forming apparatus.

12 Claims, 14 Drawing Sheets

(51) Int. Cl.
  *B05B 13/04* (2006.01)
  *B05B 16/60* (2018.01)
  *B05B 17/06* (2006.01)
  *B05D 1/02* (2006.01)
  *B05D 3/06* (2006.01)
  *C23C 24/08* (2006.01)
  *G03F 7/16* (2006.01)
  *H10K 71/00* (2023.01)
  *H10K 71/60* (2023.01)
  *B05D 3/10* (2006.01)

(52) U.S. Cl.
  CPC .......... *B05B 13/0463* (2013.01); *B05B 16/60* (2018.02); *B05B 17/06* (2013.01); *B05D 1/02* (2013.01); *B05D 3/062* (2013.01); *C23C 24/082* (2013.01); *G03F 7/16* (2013.01); *H10K 71/611* (2023.02); *B05D 3/06* (2013.01); *B05D 3/10* (2013.01); *B05D 2252/02* (2013.01)

(58) Field of Classification Search
  CPC ... B05B 16/60; B05B 7/1459; B05B 11/1039; B05B 7/0087
  USPC .......................................................... 118/326
  See application file for complete search history.

(56) References Cited

U.S. PATENT DOCUMENTS

| | | | | |
|---|---|---|---|---|
| 3,148,084 A | * | 9/1964 | Chamberlin | C01G 1/12 427/64 |
| 3,475,198 A | * | 10/1969 | Drum | D01D 5/0069 264/441 |
| 4,124,437 A | * | 11/1978 | Bond | C23F 1/08 156/345.19 |
| 4,321,299 A | * | 3/1982 | Frosch | B01D 69/12 442/379 |
| 4,327,119 A | * | 4/1982 | Lis | C23C 18/08 136/260 |
| 4,425,869 A | * | 1/1984 | Hull | G03F 7/3042 118/314 |
| 4,521,445 A | * | 6/1985 | Nablo | B32B 38/08 976/DIG. 444 |
| 4,605,574 A | * | 8/1986 | Yonehara | B05B 7/0012 118/227 |
| 4,822,639 A | * | 4/1989 | Fujii | B05C 11/08 118/52 |
| 4,825,229 A | * | 4/1989 | Matsumoto | B41J 2/04 347/21 |
| 4,901,666 A | * | 2/1990 | Nagasaka | B05B 5/032 118/634 |
| 4,976,810 A | * | 12/1990 | Masuda | C23F 1/02 156/345.11 |
| 5,063,951 A | * | 11/1991 | Bard | B08B 3/04 118/411 |
| 5,069,157 A | * | 12/1991 | Imai | C03C 17/002 118/314 |
| 5,110,618 A | * | 5/1992 | Faust | B05B 5/08 427/482 |
| 5,230,165 A | * | 7/1993 | Beisswanger | B65H 20/14 34/640 |
| 5,658,615 A | * | 8/1997 | Hasebe | B05C 11/08 427/240 |
| 5,725,668 A | * | 3/1998 | Foster | B05B 13/0207 118/411 |
| 5,766,354 A | * | 6/1998 | Ohmori | B05C 11/08 118/319 |
| 5,803,970 A | * | 9/1998 | Tateyama | G03F 7/162 118/319 |
| 5,871,584 A | * | 2/1999 | Tateyama | G03F 7/3021 118/323 |
| 5,922,407 A | * | 7/1999 | Hess | F26B 13/104 118/305 |
| 6,022,414 A | * | 2/2000 | Miller | C03C 17/002 118/718 |
| 6,060,111 A | * | 5/2000 | Buecher | B05C 9/14 118/77 |
| 6,207,231 B1 | * | 3/2001 | Tateyama | B05C 11/08 427/240 |
| 6,258,167 B1 | * | 7/2001 | Kawano | B05C 5/001 118/667 |
| 6,280,802 B1 | * | 8/2001 | Akedo | C23C 4/02 427/180 |
| 6,350,489 B1 | * | 2/2002 | Moriyama | C23C 16/545 427/255.5 |
| 6,439,712 B1 | * | 8/2002 | Mizutani | B41J 2/01 219/216 |
| 6,709,699 B2 | * | 3/2004 | Ema | B05D 3/0254 118/320 |
| 7,279,044 B2 | * | 10/2007 | Park | B05C 5/0254 118/305 |
| 7,553,375 B2 | * | 6/2009 | Sekiya | B41J 2/14016 118/326 |
| 7,691,448 B2 | * | 4/2010 | Steckelberg | B05D 7/04 427/532 |
| 8,053,174 B2 | * | 11/2011 | Yamazaki | C23C 16/45589 430/312 |
| 8,062,922 B2 | * | 11/2011 | Britt | H01L 31/03928 438/95 |
| 8,236,376 B2 | * | 8/2012 | Perera | D06M 11/46 427/196 |
| 8,770,143 B2 | * | 7/2014 | Endo | C23C 16/4412 118/723 R |
| 8,840,958 B2 | * | 9/2014 | Lee | C23C 16/403 118/715 |
| 9,114,639 B2 | * | 8/2015 | Sasaki | B41J 11/002 |
| 9,855,579 B2 | * | 1/2018 | Yang | B05C 11/1039 |
| 10,365,420 B2 | * | 7/2019 | Yoon | G02B 5/305 |
| 2001/0004916 A1 | * | 6/2001 | Ogita | B05D 1/26 156/278 |
| 2002/0187272 A1 | * | 12/2002 | Kojima | B05D 1/025 427/58 |
| 2003/0139064 A1 | * | 7/2003 | Nishida | H01L 21/31691 438/785 |
| 2004/0159285 A1 | * | 8/2004 | Doehler | B01J 3/02 118/718 |
| 2005/0084606 A1 | * | 4/2005 | Park | B05C 5/0254 427/162 |
| 2005/0207901 A1 | * | 9/2005 | Klobucar | B05B 7/1459 417/182 |
| 2005/0233071 A1 | * | 10/2005 | Fung | B05C 19/001 427/180 |
| 2006/0040051 A1 | * | 2/2006 | Yamamoto | G03F 7/3028 427/240 |
| 2006/0199476 A1 | * | 9/2006 | Cok | B23K 26/1464 451/38 |
| 2007/0017442 A1 | * | 1/2007 | Yamasaki | H01L 21/6715 118/695 |
| 2007/0054044 A1 | * | 3/2007 | Shimosaki | B01J 35/004 427/248.1 |
| 2007/0120932 A1 | * | 5/2007 | Miura | B41J 3/407 347/102 |
| 2007/0275490 A1 | * | 11/2007 | Yamazaki | H01L 51/0004 438/29 |
| 2008/0166487 A1 | * | 7/2008 | Steckelberg | B05C 5/0245 427/420 |
| 2009/0042394 A1 | * | 2/2009 | Yamazaki | C23C 16/45589 438/694 |
| 2009/0066976 A1 | * | 3/2009 | Uchida | B41J 2/16532 358/1.7 |
| 2009/0272322 A1 | * | 11/2009 | Fujinami | B05D 1/60 118/724 |
| 2010/0327014 A1 | * | 12/2010 | Jonas | H05K 3/305 427/58 |
| 2011/0056074 A1 | * | 3/2011 | Jonas | B23K 1/0016 29/829 |

(56) References Cited

U.S. PATENT DOCUMENTS

| | | | |
|---|---|---|---|
| 2011/0073035 A1* | 3/2011 | Horikawa | B05C 5/0254 |
| | | | 118/300 |
| 2011/0143019 A1* | 6/2011 | Mosso | C23C 16/26 |
| | | | 427/209 |
| 2012/0292377 A1* | 11/2012 | Shoji | B23K 1/0016 |
| | | | 228/248.1 |
| 2013/0092239 A1* | 4/2013 | Mori | B05D 3/067 |
| | | | 427/515 |
| 2014/0065295 A1* | 3/2014 | Emoto | B05D 1/005 |
| | | | 427/8 |
| 2015/0031151 A1* | 1/2015 | Lee | H01L 51/001 |
| | | | 438/23 |
| 2015/0224532 A1* | 8/2015 | Yang | B05C 11/1039 |
| | | | 427/240 |
| 2015/0243542 A1* | 8/2015 | Yoshihara | H01L 21/6708 |
| | | | 156/345.15 |
| 2016/0139312 A1* | 5/2016 | Yoon | G02B 5/305 |
| | | | 359/487.02 |

FOREIGN PATENT DOCUMENTS

| | | | | | |
|---|---|---|---|---|---|
| JP | 2002-217530 | | 8/2002 | | |
| JP | 2008-302298 | | 12/2008 | | |
| JP | 2009-240994 | | 10/2009 | | |
| JP | 2013-4804 | | 1/2013 | | |
| KR | 102013-00901746 | * | 8/2013 | | G02B 5/305 |
| KR | 1020130091746 | * | 8/2013 | | G02B 5/30 |

OTHER PUBLICATIONS

Chinese Office Action dated Mar. 16, 2018 in Chinese Patent Application No. 201580019801.5.
Japanese Office Action dated Dec. 11, 2018 in Japanese Patent Application No. 2016-513844.
Japanese Office Action dated May 7, 2019 in Japanese Patent Application No. 2016-512844.

* cited by examiner

FIG. 13

|  | 1NL/min | 2NL/min | 3NL/min | 4NL/min | 5NL/min |
|---|---|---|---|---|---|
| UNIFORMITY EVALUATION VALUE | 165% | 154% | 145% | 140% | 120% |
| FILM FORMATION SPEED | 140nm/min | 135nm/min | 132nm/min | 130nm/min | 130nm/min |

FILM FORMING APPARATUS INCLUDING A SPRAYER PORT AND EXHAUST PORT ON A SUPPLY PIPE

CROSS-REFERENCE TO RELATED APPLICATIONS

This application is a Continuation of International Application No. PCT/JP2015/061898 filed on Apr. 17, 2015, which is based upon and claims the benefit of priority from Japanese Patent Application No. 2014-086033 filed on Apr. 18, 2014, the contents all of which are incorporated herein by reference.

TECHNICAL FIELD

The present invention relates to a film forming apparatus for forming a thin film on a substrate by spraying a thin film material, as well as to a substrate processing apparatus and a device manufacturing method.

BACKGROUND ART

In Japanese Laid-Open Patent Publication No. 2002-075641, a device is manufactured by forming a thin film on a substrate by spraying a mist.

SUMMARY OF INVENTION

However, in the case that a liquid containing the thin film material is converted into a mist and coated on the substrate, due to the fact that liquid pooling occurs locally on the surface of the substrate, it is problematic for the thin film to be formed on the substrate at a uniform thickness.

According to a first aspect of the present invention, a film forming apparatus configured to form a thin film on a substrate comprises a spraying unit configured to spray a thin film material, and an exhaust unit configured to discharge a gas, wherein an exhaust port of the exhaust unit is disposed on a side that is opposite to a direction in which gravity acts with respect to the substrate.

According to a second aspect of the present invention, a substrate processing apparatus comprises the film forming apparatus according to the first aspect, and an exposure device configured to expose a predetermined pattern on the substrate by illuminating the substrate, on which the thin film is formed by the film forming apparatus, with light.

According to a third aspect of the present invention, a device manufacturing method for manufacturing a device comprises a film forming step of forming a thin film on a substrate, using the film forming apparatus according to the first aspect, and an exposure step of exposing a predetermined pattern on the substrate by illuminating the substrate, on which the thin film is formed by the film forming step, with light.

BRIEF DESCRIPTION OF DRAWINGS

FIG. 13 is a table in which there are shown evaluation results for film thickness uniformity according to the Comparative Example 3.

DESCRIPTION OF EMBODIMENTS

Preferred embodiments of a film forming apparatus, a substrate processing apparatus equipped with the film forming apparatus, and a device manufacturing method for manufacturing a device using the film forming apparatus according to aspects of the present invention will be presented and described in detail below with reference to the accompanying drawings. The aspects of the present invention are not limited to these embodiments, and may also include various modifications or improvements.

First Embodiment

Figure 1:
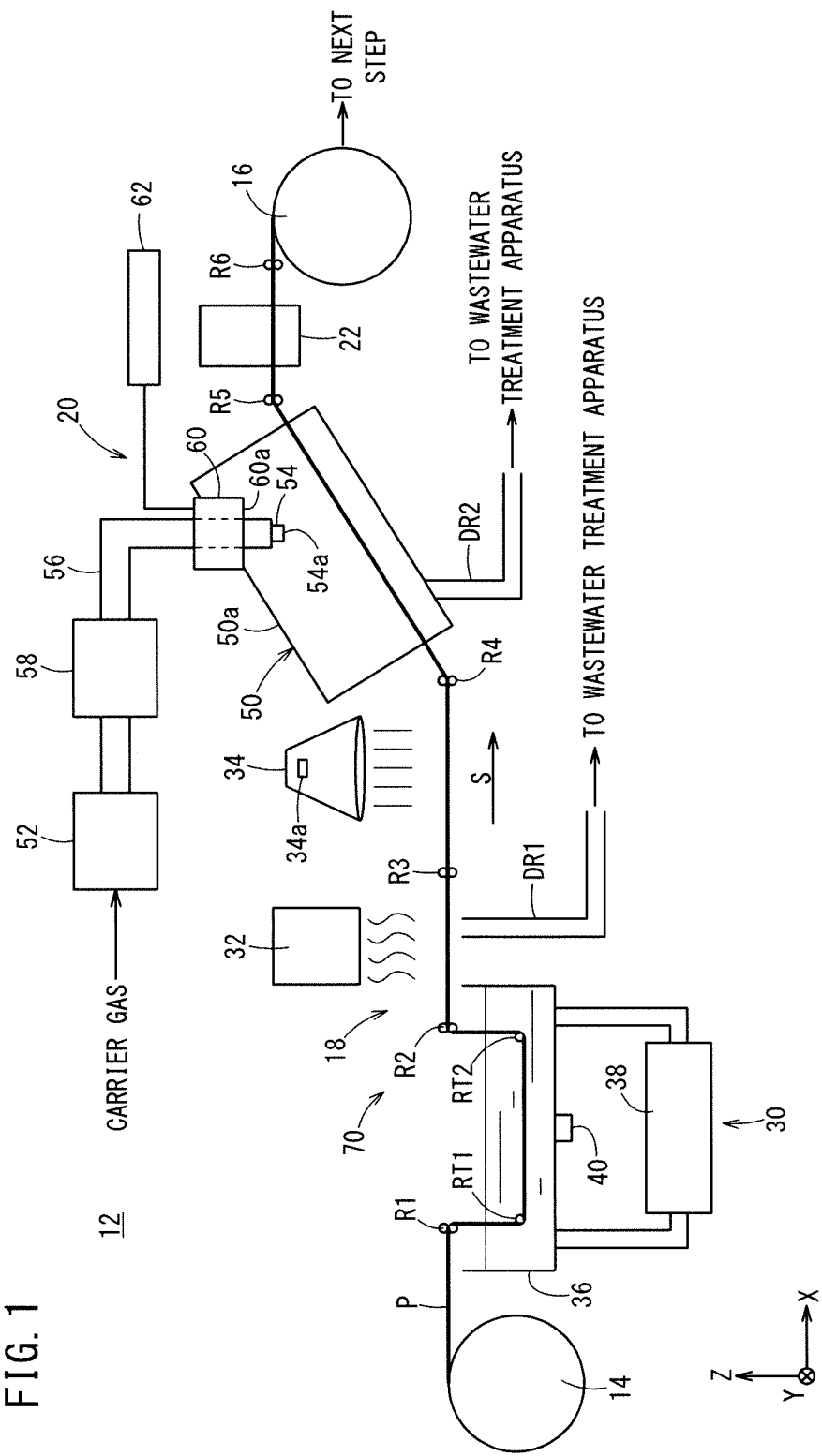
FIG. 1 is a view showing in outline a configuration of a substrate processing apparatus for manufacturing a device by carrying out a predetermined process with respect to the substrate according to a first embodiment.

FIG. 1 is a view showing in outline a configuration of a substrate processing apparatus 12 for manufacturing a device by carrying out a predetermined process with respect to a substrate P. In the following description, an XYZ orthogonal coordinate system is set, in which the X direction, the Y direction, and the Z direction are described in accordance with the arrows shown in the drawings.

The substrate processing apparatus 12, for example, is a system for manufacturing a flexible display as a device. As an example of the flexible display, there may be offered, for example, an organic EL display or the like. The substrate processing apparatus 12 includes a so-called roll-to-roll type structure, in which a substrate P is delivered from a supply roll 14 on which a flexible substrate (sheet substrate) P is wound in a roll-like shape, and after the substrate processing apparatus 12 has implemented various processes with respect to the delivered substrate P, the substrate P after the various processes have been implemented thereon is wound up onto a take-up roll 16. The substrate P has a band-like shape, in which a direction of movement of the substrate P is defined by a longitudinal direction (elongate dimension), and a transverse direction thereof is defined by a lateral direction (shorter dimension). After the various processes have been implemented, the substrate P acquires a state in which plural devices are arranged continuously thereon, and becomes a substrate for use as a multi-pattern substrate. Concerning the substrate P that is delivered from the supply roll 14, various processes are implemented sequentially thereon by a cleaning apparatus 18 of the substrate processing apparatus 12, a film forming apparatus 20, and an exposure apparatus 22, etc., and then the substrate P is wound up onto the take-up roll 16.

The X direction is a direction in which the substrate P is conveyed in the horizontal plane, and the Y direction is a transverse direction of the substrate P, which is a direction that is perpendicular to the X direction in the horizontal plane. The Z direction is a direction (upward direction) that is perpendicular to the X direction and the Y direction. The −Z direction is the direction of gravity (a direction in which gravity acts, or stated otherwise, a direction in which gravity is applied). The horizontal plane is a plane that is perpendicular to the direction of gravity.

As the material for the substrate P, there may be used, for example, a resin film, or a foil that is made up from a metal or a metal alloy of stainless steel or the like. As the material of the resin film, there may be used, for example, a material containing at least one or more of a polyethylene resin, a polyether resin, a polypropylene resin, a polyester resin, an ethylene vinyl copolymer resin, a polyvinyl chloride resin, a polyphenylene sulfide resin, a polyarylate resin, a cellulose resin, a polyamide resin, a polyimide resin, a polycarbonate resin, a polystyrene resin, and a vinyl acetate resin. Further, the thickness and rigidity (Young's modulus) of the substrate P may lie within a range so as not to cause creases or irreversible wrinkles by buckling of the substrate P. As the base material of the substrate P, a film having a thickness on the order of 25 μm to 200 μm of PET (polyethylene terephthalate), PEN (polyethylene naphthalate), or PES (polyethersulfone), etc., may be cited as typical examples.

Because cases occur in which the substrate P receives heat during the various processes implemented by the substrate processing apparatus 12, preferably, a substrate of a material for which the coefficient of thermal expansion thereof is not remarkably large is selected. The coefficient of thermal expansion can be suppressed, for example, by mixing an inorganic filler in a resin film. For example, a material such as titanium oxide, zinc oxide, alumina, or silicon oxide or the like may be used for the inorganic filler. Furthermore, the substrate P may be a single layer body of an ultra-thin glass having a thickness of about 100 μm, which is manufactured by a float method or the like, or a laminated body in which a resin film or a foil or the like is bonded to the ultra-thin glass.

The cleaning apparatus 18 serves to clean the substrate P as it is conveyed continuously. The cleaning apparatus 18 is equipped with an ultrasonic cleaning device 30 for ultrasonically cleaning the substrate P with an alcohol washing solution, a blower fan 32 for removing the alcohol washing solution that remains on the substrate P (the surface of the substrate P) on which ultrasonic cleaning has been performed, and a UV irradiation device 34 for irradiating with ultraviolet (UV) rays the surface of the substrate P from which the alcohol washing solution has been removed by the blower fan 32.

The ultrasonic cleaning device 30 includes a cleaning tank 36 in which the alcohol washing solution is stored, and a circulation system 38 having a non-illustrated pump for circulating the alcohol washing solution that is stored in the cleaning tank 36. An ultrasonic vibrator 40, which generates ultrasonic vibrations, is provided on the bottom of the cleaning tank 36. The ultrasonic vibrator 40 is vibrated mechanically, whereby ultrasonic waves are output into the interior of the cleaning tank 36. Accordingly, the substrate P, which is conveyed to the cleaning tank 36, is ultrasonically cleaned by the alcohol washing solution. As the alcohol washing solution, there may be used any of methanol, ethanol, isopropyl alcohol (IPA), or the like. Moreover, the circulation system 38 need not necessarily be provided.

By delivering air to the substrate P, the blower fan 32 removes any of the alcohol washing solution that remains on the substrate P. The UV irradiation device 34 includes a low-pressure mercury lamp 34a that generates ultraviolet rays, and with the ultraviolet rays, irradiates the surface of the substrate P, which is conveyed continuously. By irradiating the substrate P with ultraviolet rays, it is possible to perform UV ozone cleaning for removing organic contamination and carrying out surface modification on the surface of the substrate P. By the ultraviolet radiation, the surface of the substrate P is modified into a hydrophilic surface. The ultraviolet radiation preferably has a wavelength of 200 nm or less. In order to irradiate ozone on the substrate P with good efficiency, preferably, the UV irradiation device 34 irradiates the substrate P with ultraviolet radiation in the interior of a space that is enclosed or sealed to a certain degree.

Further, a drain flow passage DR1 is disposed at a position facing the blower fan 32, and the alcohol washing solution that remains on the substrate P is discharged from the drain flow passage DR1 toward a non-illustrated wastewater treatment apparatus.

The film forming apparatus 20 forms a thin film on the surface of the substrate P that is cleaned and conveyed continuously by the cleaning apparatus 18. The film forming apparatus 20 includes a film forming chamber 50, and forms the thin film on the substrate P that is conveyed into the interior of the film forming chamber 50. The film forming apparatus 20 forms the thin film on the substrate P under atmospheric pressure by spraying a mist including the thin film material. Formation of the thin film may be carried out under a predetermined pressure and not necessarily atmospheric pressure.

More specifically, the film forming apparatus 20 includes the film forming chamber 50, a mist supplying device 52, a nozzle (spraying unit) 54, a supply pipe 56, a filter 58, an exhaust unit 60, and a suction device 62. The mist supplying device 52 atomizes a liquid including the film forming material for forming the thin film, and supplies the atomized liquid, i.e., a mist, to the nozzle 54 at a predetermined flow rate. The mist supplying device 52 is connected to the nozzle 54 via the supply pipe 56, whereby the mist is supplied to the nozzle 54 through the supply pipe 56.

Concerning the method for generating the mist, although various methods are known, there may be used, for example, a method by which the liquid is atomized by releasing a binding of the liquid itself by imparting ultrasonic vibrations to the liquid from an ultrasonic vibrator, or an electrostatic method for atomizing the liquid by applying a voltage directly to a narrow tube for spraying the mist. Further, other methods are possible, such as a pressurizing method for scattering and atomizing the liquid by causing a gas, to which a pressure is applied for increasing the flow rate thereof, and the liquid to collide, and a rotating disk method by which droplets of the liquid are dropped onto a disk that rotates at a high speed, and the droplets are scattered and atomized by centrifugal force. Furthermore, an orifice vibrating method may also be used in which, when droplets of the liquid pass through an orifice plate having a micro-sized orifice therein, vibrations are imparted by a piezoelectric element or the like, whereby the droplets are severed and atomized. A method can be arbitrarily selected suitably from among such methods depending on factors such as cost and performance, etc. The mist may also be generated by combining a plurality of such methods.

As a specific method for supplying the mist including the film forming material to the nozzle 54, a carrier gas, which is a compressed gas, is used. More specifically, the carrier gas is supplied to the mist supplying device 52, and by the mist supplying device 52 allowing the supplied carrier gas to flow to the supply pipe 56, the atomized mist is supplied together with the carrier gas to the nozzle 54. By changing the flow rate (NL/min) at which the carrier gas flows in the supply pipe 56, the flow velocity of the mist supplied to the nozzle 54 can be changed.

As the liquid (film forming liquid) that is used for forming the film, there may be used, for example, a solution into which the film forming material is dissolved into a solvent, or a dispersion in which fine particles of the thin film material are dispersed in a dispersion medium. As the film forming material, there can be used metal oxide fine particles including at least one from among conductive fine metal particles including indium, zinc, tin, silicon, and titanium, etc. Further, as the solvent or the dispersion medium, there can be used a material that can be atomized independently, such as an aqueous solvent, or ethanol, isopropyl alcohol (IPA), and the like. More specifically, as examples of the liquid, there can be cited an aqueous dispersion containing fine particles of ITO (indium tin oxide) as the thin film material, or a dispersion prepared by dispersing fine particles of $SiO_2$ (silicon dioxide) as the thin film material in an IPA dispersion medium. Further, as the carrier gas, nitrogen, or an inert gas such as a noble gas or the like can be used.

The filter 58 is disposed in the supply pipe 56. The filter 58 serves to allow the thin film material (fine particles) that are smaller than a predetermined particle diameter to penetrate therethrough, from among the thin film material (fine particles) contained within the mist that is supplied to the nozzle 54 from the mist supplying device 52. Owing thereto, the thin film material, i.e., fine particles, which are greater than or equal to a predetermined particle diameter, are not supplied to the nozzle 54, and the accuracy in forming the film can be improved. Further, by providing the filter 58, even in the case that foreign matter such as waste material or the like is contained in the liquid, such foreign matter can be blocked from being supplied to the nozzle 54.

The nozzle 54, which is disposed on a distal end on the downstream side of the supply pipe 56, is inserted into the interior of the film forming chamber 50. The downstream side of the supply pipe 56 refers to a downstream side as viewed from the direction in which the mist is supplied. The mist that is supplied to the nozzle 54 is sprayed together with the carrier gas from a spraying port 54*a* of the nozzle 54. Accordingly, at the interior of the film forming chamber 50, film formation can be carried out on the surface of the continuously delivered substrate P. By such film formation, a functional material layer is formed on the surface of the substrate P. Moreover, the nozzle 54 may include a non-illustrated movable member that is capable of changing the spraying direction in which the thin film material is sprayed. Owing to this feature, it is possible to adjust the direction in which the film forming material is sprayed in accordance with properties such as the film forming material, the film forming conditions, the film forming time, and the circumstances of film formation, etc.

During film formation, preferably, the mist that is sprayed onto the substrate P is of a temperature lower than a softening point of the substrate P. The softening point refers to a temperature at which deformation starts to take place due to softening of the substrate P, in the event that the substrate P is subjected to heat. The softening point can be determined, for example, by an experimental method (Method A) as defined by JIS K7207. According to the first embodiment, the supply pipe 56 is disposed in the film forming chamber 50 so that the axial center thereof is perpendicular to the horizontal plane.

When the film is formed, an auxiliary film forming step may also be carried out by an atmospheric pressure plasma, by imposing a high frequency voltage using a gas such as helium or the like. As the gas that is used in this case, although helium is preferred, nitrogen, argon, or air may also be employed. Imposition of the high frequency voltage, for example, is carried out with respect to a pair of electrodes (not shown), which are disposed between the nozzle 54 and the substrate P.

The exhaust unit 60 is disposed in the film forming chamber 50 for discharging the gas inside the film forming chamber 50. More specifically, the exhaust unit 60 is disposed on an outer wall 50*a* of the film forming chamber 50, and an exhaust port 60*a* of the exhaust unit 60 is disposed in the interior of the film forming chamber 50 (including the outer wall 50*a* of the film forming chamber 50). The gas in the interior of the film forming chamber 50 is introduced into the exhaust unit 60 from the exhaust port 60*a*. The suction device 62 that aspirates the gas is disposed in the exhaust unit 60. In accordance therewith, the gas in the interior of the film forming chamber 50 is drawn into the exhaust unit 60 from the exhaust port 60*a* and is discharged to the exterior (externally of the film forming chamber 50). The exhaust port 60*a* of the exhaust unit 60 is arranged on a side that is opposite (a side in the +Z direction) to the direction of gravity with respect to the spraying port 54*a* of the nozzle 54, and the exhaust port 60*a* and the spraying port 54*a* are disposed while being separated at a given distance. The exhaust unit 60 may also exhaust a gas that includes the mist, or a gas that includes the carrier gas therein, etc. For example, the suction device 62 aspirates the gas, etc., with a suction force of a degree such that at least 90% or more of the mist that is sprayed by the nozzle 54 is not exhausted by the exhaust unit 60.

According to the first embodiment, the exhaust unit 60 comprises an exhaust pipe having a cylindrical shape, and an axial center of the exhaust pipe is disposed perpendicularly with respect to the horizontal plane. Further, the supply pipe 56 is disposed so as to penetrate through the center of the exhaust unit 60, and the nozzle 54 is disposed on a distal end of the supply pipe 56 downwardly of the exhaust unit 60. Stated otherwise, the exhaust unit 60 is disposed around the supply pipe 56. Consequently, the exhaust port 60*a* can be disposed on the supply pipe 56 at a position that is separated from the spraying port 54*a* of the nozzle 54. Owing thereto, it can be made more difficult for the mist that is sprayed out from the spraying port 54*a* to be exhausted from the exhaust port 60*a*. The supply pipe 56 and the exhaust unit 60 may also be provided together in an integral manner.

Moreover, a hood member, which defines a film forming space in the vicinity of the film forming surface of the substrate P, may be provided on the supply pipe 56. Such a hood member may include any of various shapes such as, for example, a conical shape, a rectangular shape, or a cylindrical shape or the like, and by changing the shape of the hood member, it is possible to adjust the film forming environment in the vicinity of the film forming surface of the substrate P. Further, the hood member is not limited to being provided on the supply pipe 56, but may also be disposed on the exhaust unit 60. By providing the hood member on the exhaust unit 60, spraying of mist is enabled from the spraying port 54a of the nozzle 54 into the film forming space, which is covered by the hood member, whereby it is possible to increase the film thickness uniformity of the thin film that is formed on the substrate P. As a result, formation of the film on the substrate P can be performed with high accuracy. The film forming chamber 50 may include a space defining member of any of various shapes such as a rectangular shape, a cylindrical shape, a semi-cylindrical shape, a polygonal shape, or the like. By adopting the respective shapes, in the film forming chamber 50, it is possible to adjust the film forming environment of the space in which film formation is carried out. Adjustment of the film forming environment refers to features such as, for example, adjusting the airflow (flow), humidity, temperature, gas partial pressure, etc., of the mist or the carrier gas in the environment.

A drain flow passage DR2 is disposed in the film forming chamber 50. Any of the thin film material, the solvent, or the dispersion medium that has not been fixed onto the substrate P is discharged from the drain flow passage DR2 toward a non-illustrated wastewater treatment apparatus. Further, the film forming apparatus 20 may carry out a film firing treatment, or an irradiation treatment for irradiating microwaves or ultraviolet rays with respect to the substrate P on which the film has been formed.

The exposure apparatus 22 performs exposure with respect to the surface of the substrate P, which is subjected to film formation and conveyed continuously by the film forming apparatus 20. The exposure apparatus 22 exposes a predetermined pattern on the substrate P by irradiating light (for example, laser light) with respect to the substrate P on which the film has been formed. The exposure apparatus 22 may be a direct rendering type of exposure apparatus in which a mask is not used, a so-called raster scan type of exposure apparatus, or an exposure apparatus in which a mask is used. Further, the exposure apparatus 22 may be an exposure apparatus that exposes a predetermined pattern using a digital micromirror device (DMD). The exposure apparatus 22 exposes with respect to the substrate P a predetermined pattern of wiring or circuitry that is needed to manufacture a device such as a flexible display or the like.

The substrate processing apparatus 12 is further equipped with a substrate conveying device 70. The substrate conveying device 70 conveys the substrate P, which is conveyed from the supply roll 14 to the take-up roll 16, at a predetermined velocity. The substrate conveying device 70 includes drive rollers R1 to R6, and tension rollers RT1, RT2. The drive rollers R1 to R6 are arranged with intervals therebetween along the direction of conveyance S of the substrate P. The drive rollers R1 to R6 are rotated while retained on both front and rear surfaces of the substrate P, and convey the substrate P at a predetermined velocity toward the take-up roll 16. The drive rollers R1 to R6 are disposed in this order from an upstream side to a downstream side of the direction of conveyance S of the substrate P. Moreover, the drive rollers R1 to R6 are rotated by non-illustrated motors or the like.

The drive rollers R1, R2 are disposed on the +Z direction side of the cleaning tank 36, and the drive roller R1 is disposed on the upstream side in the direction of conveyance S with respect to the drive roller R2. The drive roller R3 is disposed between the blower fan 32 and the UV irradiation device 34, and the drive roller R4 is disposed between the UV irradiation device 34 and the film forming chamber 50. The drive roller R5 is disposed between the film forming chamber 50 and the exposure apparatus 22, and the drive roller R6 is disposed between the exposure apparatus 22 and the take-up roll 16. The tension rollers RT1, RT2 apply a predetermined tension with respect to the substrate P that is conveyed between the drive roller R1 and the drive roller R2, together with playing a roll to immerse the substrate P in the alcohol washing solution in the interior of the cleaning tank 36. More specifically, the tension roller RT1 is disposed in the interior of the cleaning tank 36 more in the −Z direction than the drive roller R1, and the tension roller RT2 is disposed in the interior of the cleaning tank 36 more in the −Z direction than the drive roller R2. The positions of the tension rollers RT1, RT2 in the Z direction are mutually the same.

By changing the positions in the Z direction of the drive roller R4 and the drive roller R5, the substrate conveying device 70 is capable of conveying the substrate P to the film forming apparatus 20 (the interior of the film forming chamber 50) in a state of being inclined arbitrarily with respect to the horizontal plane. Stated otherwise, the substrate P, which is conveyed to the film forming apparatus 20 (the interior of the film forming chamber 50), can be inclined at an arbitrary angle with respect to the horizontal plane. Further, by placing the positions of the drive roller R4 and the drive roller R5 at the same position in the Z direction, the substrate conveying device 70 is capable of conveying the substrate P to the film forming apparatus 20 (the interior of the film forming chamber 50) in parallel with the horizontal plane. Consequently, the film forming apparatus 20 is capable of forming the thin film on the substrate P, which is conveyed while being inclined with respect to the horizontal plane, or on the substrate P, which is conveyed in parallel with the horizontal plane.

EXAMPLES

Example 1

Figure 2:
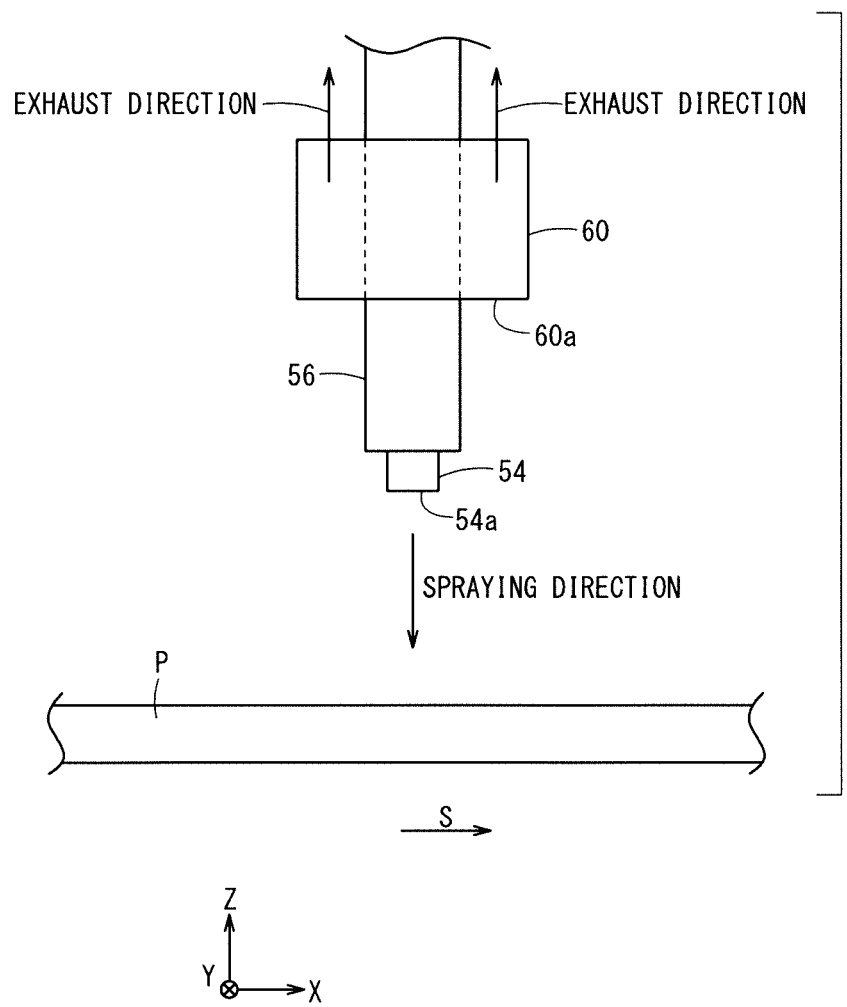
FIG. 2 is a view showing a positional relationship between a nozzle and an exhaust unit and a substrate according to an Example 1.

FIG. 2 is a view showing a positional relationship between the nozzle 54 and the exhaust unit 60 and the substrate P according to an Example 1. According to the Example 1, the angle of inclination of the substrate P in the direction of conveyance S in the interior of the film forming chamber 50 is 0°, or in other words, the substrate P is conveyed in parallel with the horizontal plane. Further, the spraying direction of the mist that is sprayed toward the substrate P from the spraying port 54a of the nozzle 54 is perpendicular with respect to the substrate P (horizontal plane), and the exhaust direction in which the gas, etc., is discharged (aspirated) from the exhaust port 60a of the exhaust unit 60 also is perpendicular with respect to the substrate P (horizontal plane). More specifically, according to the present Example 1, the mist is sprayed in the direction of the arrow, which is indicative of the spraying direction in FIG. 2. Further, the gas is exhausted in the directions of the arrows, which are indicative of the exhaust direction in FIG. 2. In FIG. 2, illustration of the film forming chamber 50 is omitted.

Further, according to Example 1, an aqueous dispersion (NanoTek (registered trademark) Slurry made by C.I. Kasei Co., Ltd.) including fine particles of ITO was used as a liquid. The particle diameter of such ITO fine particles was within a range of 10 nm to 50 nm with an average particle diameter of 30 nm, and the density of the metal oxide fine particles in the aqueous dispersion was 15 wt %. Further, with the mist supplying device 52, the liquid was atomized by applying a voltage to an ultrasonic vibrator and vibrating the ultrasonic vibrator at 2.4 MHz. In addition, using nitrogen as a carrier gas, by having the carrier gas flow at 4 NL/min into the supply pipe 56, the atomized mist was carried to the nozzle 54. PET was adopted as the material of the substrate P. Moreover, during film formation, no heating was applied. Under these conditions, the spray time of the mist was adjusted and film formation was carried out so as to form a thin film with a film thickness of 300 nm.

With respect to the thin film having a formed area of 2 cm (in the transverse direction of the substrate P)×10 cm (in the direction of conveyance S of the substrate P), the resistance thereof was measured using a two-terminal method, whereby the film thickness uniformity was evaluated. Concerning measurement of the resistance value, such a measurement was performed at each of 2 cm intervals along the transverse direction and the direction of conveyance S of the substrate P. An evaluation value for the film thickness uniformity was 52%. The evaluation value for the film thickness uniformity is indicative of the fact that the film thickness becomes more uniform the lower such a value is. Further, the speed at which the film was formed was 60 nm/min.

The evaluation value for the film thickness uniformity is calculated using the following formula:

$$\text{Evaluation Value of Film Thickness Uniformity} = (Rs_{max} - Rs_{min})/Rs_{min} \times 100 \quad (1)$$

where $Rs_{max}$ indicates a maximum value of the resistance value, and $Rs_{min}$ indicates a minimum value of the resistance value. Stated otherwise, the calculation is carried out in accordance with the highest resistance value $Rs_{max}$ and the lowest resistance value $Rs_{min}$, from among the plural resistance values that were measured with respect to the thin film of 2 cm×10 cm.

Comparative Example 1

Figure 3:
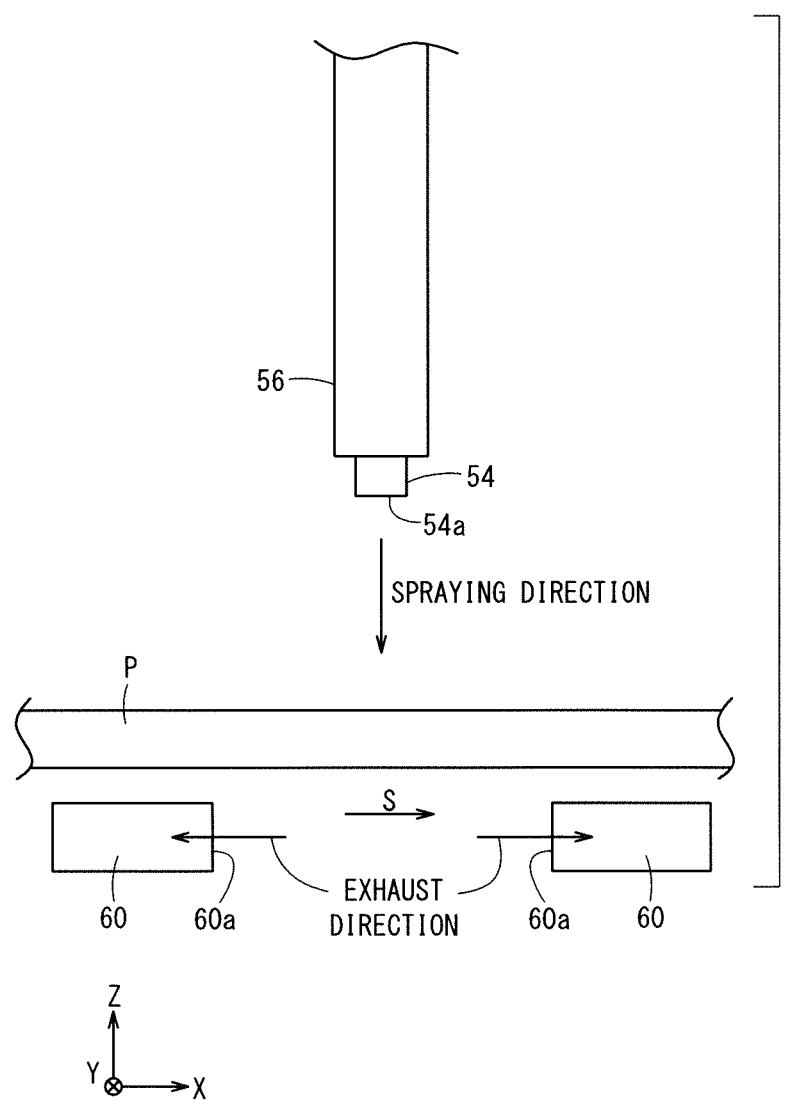
FIG. 3 is a view showing a positional relationship between a nozzle and an exhaust unit and a substrate according to a Comparative Example 1.

FIG. 3 is a view showing a positional relationship between the nozzle 54 and the exhaust unit 60 and the substrate P according to a Comparative Example 1. In Comparative Example 1, in a manner different from Example 1, exhaust units 60 are arranged more on the −Z direction side than the substrate P, and are arranged respectively on an upstream side and a downstream side in the direction of conveyance S of the substrate P. Other various conditions thereof, for example, conditions such as the material and angle of inclination of the substrate P, the type of liquid, the method by which the mist is generated, the type and flow rate of the carrier gas, and the spraying direction of the nozzle 54, etc., are the same as in Example 1. Under these conditions, the spray time of the mist was adjusted and film formation was carried out so as to form a thin film with a film thickness of 300 nm. In FIG. 3 as well, illustration of the film forming chamber 50 is omitted. Further, according to the present Comparative Example 1, the mist is sprayed in the direction of the arrow, which is indicative of the spraying direction in FIG. 3. Further, the gas is exhausted in the directions of the arrows, which are indicative of the exhaust directions in FIG. 3.

With respect to the thin film having a formed area of 2 cm (in the transverse direction of the substrate P)×10 cm (in the direction of conveyance S of the substrate P), the resistance thereof was measured using a two-terminal method, whereby the film thickness uniformity was evaluated. The evaluation value for the film thickness uniformity was 120%, with the result that the uniformity was inferior in comparison with that of Example 1. Further, the speed at which the film was formed was 20 nm/min, with the result that the film formation speed was slower in comparison with that of Example 1. Moreover, the method for calculating the evaluation value for the film thickness uniformity in Comparative Example 1 is the same as that used in Example 1.

As reason for the improvement in the film thickness uniformity of Example 1 in contrast to Comparative Example 1, it is due to the fact that the exhaust port 60a of the exhaust unit 60 is disposed on a side that is opposite to the direction of gravity with respect to the spraying port 54a of the nozzle 54. To explain in greater detail, the mist that is sprayed from the spraying port 54a of the nozzle 54 is moved downwardly (in the −Z direction) by gravity. However, the gas, etc., in the interior of the film forming chamber 50 is exhausted (aspirated) upwardly (in the +Z direction) by the exhaust port 60a of the exhaust unit 60, which is located upwardly (in the +Z direction) from the spraying port 54a of the nozzle 54. Owing thereto, the mist becomes more likely to reside on the upper side (on the surface side or in the vicinity of the film forming surface) of the substrate P, and film thickness uniformity is improved. Further, because the exhaust port 60a of the exhaust unit 60 is disposed at a position that is separated from the spraying port 54a of the nozzle 54, it is unlikely for the mist that is sprayed from the spraying port 54a to be exhausted from the exhaust port 60a. Consequently, it becomes easy for the mist to reside on the surface side or in the vicinity of the film forming surface of the substrate P, and the film thickness uniformity of the thin film to be formed can further be improved.

In contrast thereto, when the exhaust ports 60a of the exhaust units 60 are disposed downwardly (in the −Z direction) from the spraying port 54a of the nozzle 54, as in Comparative Example 1, the mist that moves downwardly by gravity is moved further downward due to being exhausted (aspirated) by the exhaust ports 60a of the exhaust units 60. As a result, it becomes difficult for the mist to reside on the upper side of the substrate P, and the uniformity of the film thickness is deteriorated.

Further, even if the exhaust port 60a of the exhaust unit 60 is not arranged on a side that is opposite to the direction in which gravity acts with respect to the spraying port 54a of the nozzle 54, insofar as the exhaust port 60a of the exhaust unit 60 is arranged on a side that is opposite to the direction in which gravity acts with respect to the substrate P, since it is easier for the mist to reside on the upper side of the substrate P, film thickness uniformity is improved in comparison with Comparative Example 1.

Second Embodiment

As discussed above, according to the first embodiment, by arranging the exhaust port 60a of the exhaust unit 60 on a side that is opposite to the direction of gravity with respect to the spraying port 54a of the nozzle 54, film thickness uniformity is improved. In the second embodiment, with the condition in which the exhaust port 60a is arranged on a side that is opposite to the direction of gravity with respect to the spraying port 54a, and furthermore as shown in FIG. 4, a description will be made concerning uniformity of the film thickness, when a spraying angle α of a spraying direction of the nozzle 54 with respect to a horizontal plane, an angle of inclination β of the substrate P with respect to the horizontal plane, and an exhaust angle γ of an exhaust direction of the exhaust unit 60 with respect to the horizontal plane are changed arbitrarily.

Figure 4:
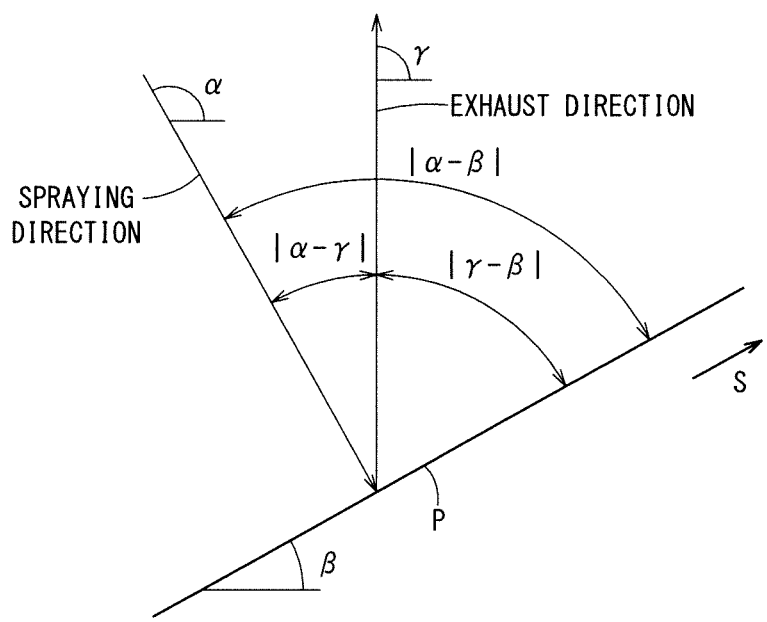
FIG. 4 is an explanatory view of a spraying angle of a spraying direction of a nozzle with respect to a horizontal plane, an angle of inclination of a substrate with respect to the horizontal plane, and an exhaust angle of an exhaust direction of the exhaust unit with respect to the horizontal plane.

In FIG. 4, the spraying angle α indicates the angle of the spraying direction of the mist that is sprayed by the nozzle 54 with respect to a horizontal plane, as determined from the direction of conveyance S of the substrate P. Further, the angle of inclination β indicates the angle of inclination of the substrate P with respect to the horizontal plane, as determined from the direction of conveyance S of the substrate P, and the exhaust angle γ indicates the angle of the exhaust direction of the gas, etc., by the exhaust unit 60 with respect to the horizontal plane, as determined from the direction of conveyance S of the substrate P. Accordingly, the angular difference between the spraying direction of the nozzle 54 and the exhaust direction of the exhaust unit 60 is represented by $|\alpha-\gamma|$. Further, the angle of the spraying direction of the nozzle 54 with respect to the substrate P is represented by $|\alpha-\beta|$, whereas the angle of the exhaust direction of the exhaust unit 60 with respect to the substrate P is represented by $|\gamma-\beta|$. According to the present embodiment, the mist is sprayed in the direction of the arrow, which is indicative of the spraying direction in FIG. 4. Further, the gas is exhausted in the direction of the arrow, which is indicative of the exhaust direction in FIG. 4. In the second embodiment, unless otherwise described, the configuration of the substrate processing apparatus 12 including the film forming apparatus 20 is the same as that of the aforementioned first embodiment.

Concerning the angle of inclination β of the substrate P, as discussed above, by changing the positions in the Z direction of the drive roller R4 and the drive roller R5 of the substrate conveying device 70, the substrate P that is conveyed into the film forming chamber 50 can be inclined arbitrarily with respect to the horizontal plane. Further, the spraying angle α of the nozzle 54 can arbitrarily be changed by changing the arrangement angle of the nozzle 54 that is provided on the supply pipe 56, and by the movable member of the nozzle 54, the spraying angle α can also be changed. Further, the exhaust angle γ can arbitrarily be changed by changing the arrangement angle of the exhaust unit 60 that is disposed in the film forming chamber 50.

EXAMPLES

Example 2

Figure 5:
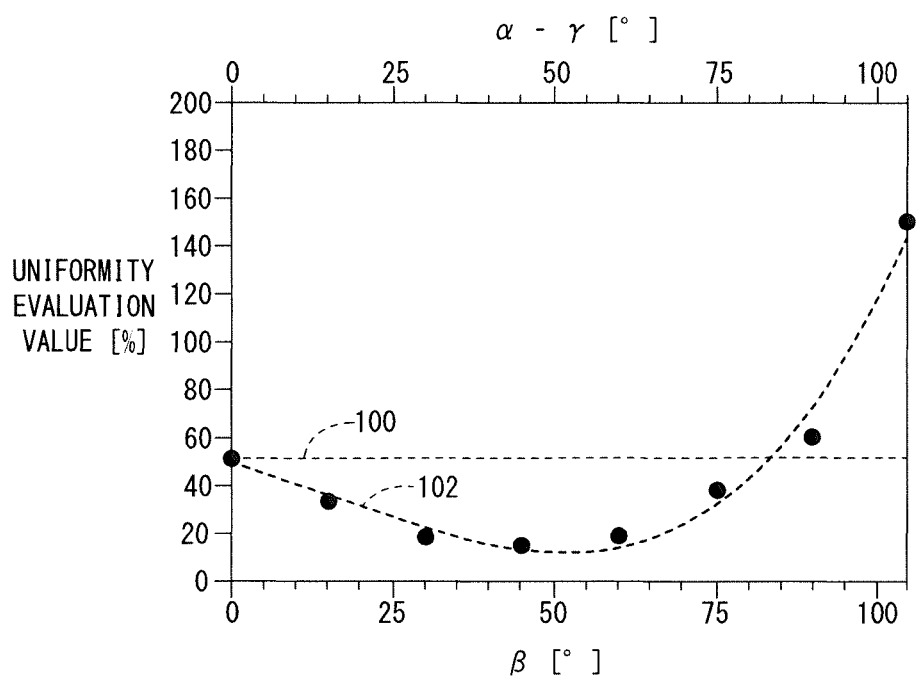
FIG. 5 is a graph showing experimental results of an Example 2.

According to Example 2, in a state in which the spraying direction of the nozzle 54 is perpendicular with respect to the substrate P (α−β=90°), and the exhaust direction of the exhaust unit 60 is perpendicular with respect to the horizontal plane (γ=90°), the film thickness uniformity was evaluated when the angle of inclination β of the substrate P was varied from 0° to 105°. Experimental results thereof are shown in FIG. 5. According to Example 2, although soda-lime glass was used as the material for the substrate P, other various conditions thereof apart from the spraying angle α of the nozzle 54 and the angle of inclination β of the substrate P, for example, conditions such as the type of liquid, the method by which the mist is generated, the type and flow rate of the carrier gas, and the exhaust direction γ of the exhaust unit 60, etc., are the same as in Example 1. Further, the spray time of the mist was adjusted and film formation was carried out so as to form a thin film with a film thickness of 300 nm.

According to Example 2, because the spraying direction of the nozzle 54 is perpendicular with respect to the substrate P, and the exhaust direction of the exhaust unit 60 is perpendicular with respect to the horizontal plane, the angle of inclination β of the substrate P becomes equivalent to the angular difference (α−γ) between the spraying direction of the nozzle 54 and the exhaust direction of the exhaust unit 60. In other words, β=α−γ. In line 100 in FIG. 5, a reference value is indicated. The reference value is an evaluation value (51.3%) of the film thickness uniformity, which is evaluated at a time that the substrate P is not inclined (the angle of inclination β of the substrate P is 0°), in which the nozzle 54 and the exhaust unit 60 of the film forming apparatus 20 are at a reference posture (the spraying angle α of the nozzle 54 is 90° and the exhaust angle γ of the exhaust unit 60 is 90°). Stated otherwise, the reference value is an evaluation value of the film thickness uniformity, which is evaluated when the positional relationship between the nozzle 54 and the exhaust unit 60 and the substrate P is as shown in FIG. 2. The fact that the reference value (51.3%) differs from the evaluation value (52%) of the film thickness uniformity according to Example 1 is a result of differences in the material properties of the substrate P. Further, the plural round black dots shown in FIG. 5 represent evaluation values of the film thickness uniformity obtained at a plurality of angles of inclination β, and a curved line 102 is an approximation curve determined from the plurality of round black dots. Moreover, the method for calculating the evaluation value for the film thickness uniformity in Example 2 is the same as that used in Example 1.

From the graph showing experimental results of FIG. 5, it could be confirmed that if the angle of inclination β of the substrate P (i.e., the angular difference (α−γ) between the spraying direction of the nozzle 54 and the exhaust direction of the exhaust unit 60) is greater than or equal to 0° and less than or equal to 85°, film thickness uniformity is obtained, which is substantially the same or superior to a condition in which the substrate P is not inclined. The reason therefore is due to the fact that, in the case that the substrate P is inclined, the mist that is sprayed from the spraying port 54a of the nozzle 54 moves obliquely downward along the surface of the substrate P by gravity, and in the case that the angle of inclination β of the substrate P lies within a range of being greater than or equal to 0° and less than or equal to 85°, the time at which the sprayed mist resides on the surface side or in the vicinity of the film forming surface of the substrate P becomes longer. In addition, furthermore, by the exhaust action performed by the exhaust unit 60, the time at which the sprayed mist resides on the surface side or in the vicinity of the film forming surface of the substrate P becomes longer. Owing thereto, the film thickness uniformity can be further improved.

Preferably, the angle of inclination β of the substrate P (i.e., the angular difference (α−γ) between the spraying direction of the nozzle 54 and the exhaust direction of the exhaust unit 60) lies within a range of being greater than or equal to 10° and less than or equal to 75°. Accordingly, the evaluation value of the obtained film thickness uniformity can be made substantially less than or equal to 40%. Further, more preferably, if the angle of inclination β of the substrate P (i.e., the angular difference (α−γ) between the spraying direction of the nozzle 54 and the exhaust direction of the exhaust unit 60) lies within a range of being greater than or equal to 20° and less than or equal to 70°, the evaluation value of the obtained film thickness uniformity can be made substantially less than or equal to 30%. Even more preferably, if the angle of inclination β of the substrate P, i.e., the angular difference (α−γ), lies within a range of 40° to 60°, the evaluation value of the film thickness uniformity becomes less than or equal to 20%. Consequently, further superior film thickness uniformity can be obtained.

Example 3

Figure 6:
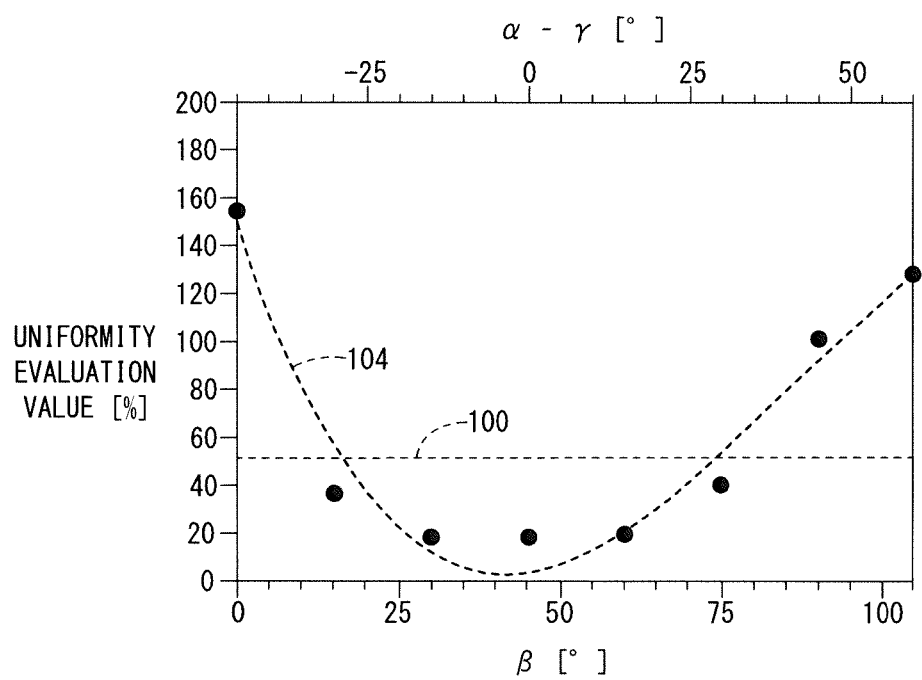
FIG. 6 is a graph showing experimental results of an Example 3.

According to Example 3, in a state in which the spraying direction of the nozzle 54 is inclined at 45° with respect to the substrate P (α−β=45°), and the exhaust direction of the exhaust unit 60 is perpendicular with respect to the horizontal plane (γ=90°), the film thickness uniformity was evaluated when the angle of inclination β of the substrate P was varied from 0° to 105°. Experimental results thereof are shown in FIG. 6. According to Example 3, other various conditions thereof apart from the spraying angle α of the nozzle 54 and the angle of inclination β of the substrate P, for example, conditions such as the material of the substrate P, the type of liquid, the method by which the mist is generated, the type and flow rate of the carrier gas, and the exhaust direction γ of the exhaust unit 60, etc., are the same as in Example 2. Further, the spray time of the mist was adjusted and film formation was carried out so as to form a thin film with a film thickness of 300 nm.

According to Example 3, because the spraying direction of the nozzle 54 is inclined at 45° with respect to the substrate P, and the exhaust direction of the exhaust unit 60 is perpendicular with respect to the horizontal plane, the angular difference (α−γ) between the spraying direction of the nozzle 54 and the exhaust direction of the exhaust unit 60 becomes 45° smaller in comparison with the angle of inclination β of the substrate P. In other words, β−45=α−γ. In line 100 in FIG. 6, a reference value (51.3%) is indicated as described by Example 2. Further, the plural round black dots shown in FIG. 6 represent evaluation values of the film thickness uniformity obtained at a plurality of angles of inclination β, and a curved line 104 is an approximation curve determined from the plurality of round black dots. Moreover, the method for calculating the evaluation value for the film thickness uniformity in Example 3 is the same as that used in Example 1.

From the graph showing experimental results of FIG. 6, it could be confirmed that if the angle of inclination β of the substrate P is greater than or equal to 15° and less than or equal to 75°, or in other words, if the angular difference (α−γ) is greater than or equal to −30° and less than or equal to 30°, an evaluation result is obtained, which is substantially equivalent to or lower than the reference value (51.3%). More specifically, if the angle of inclination β of the substrate P lies within a range of 15° to 75°, and with the nozzle 54 and the exhaust unit 60 of the film forming apparatus 20 being at the reference posture, film thickness uniformity is obtained, which is substantially the same or superior to a condition in which the substrate P is not inclined. The reason therefore is due to the fact that, in the case that the angle of inclination β of the substrate P lies within a range of 15° to 75°, the time at which the sprayed mist resides on the surface side or in the vicinity of the film forming surface of the substrate P becomes longer. In addition, furthermore, by the exhaust action performed by the exhaust unit 60, the time at which the sprayed mist resides on the surface side or in the vicinity of the film forming surface of the substrate P becomes longer. Owing thereto, the film thickness uniformity can be further improved.

Preferably, the angle of inclination β of the substrate P is greater than or equal to 20° and less than or equal to 70°, or stated otherwise, the angular difference (α−γ) lies within a range of being greater than or equal to −25° and less than or equal to 25°. Accordingly, the evaluation value of the obtained film thickness uniformity can be made substantially less than or equal to 40%. Further, more preferably, if the angle of inclination β of the substrate P is greater than or equal to 23° and less than or equal to 65°, or stated otherwise, if the angular difference (α−γ) lies within a range of being greater than or equal to −22° and less than or equal to 20°, the evaluation value of the obtained film thickness uniformity can be made substantially less than or equal to 30%. Even more preferably, if the angle of inclination β of the substrate P lies within a range of 25° to 60°, or stated otherwise, if the angular difference (α−γ) lies within a range of −20° to 15°, the evaluation value of the film thickness uniformity becomes less than or equal to 20%. Consequently, further superior film thickness uniformity can be obtained.

Example 4

Figure 7:
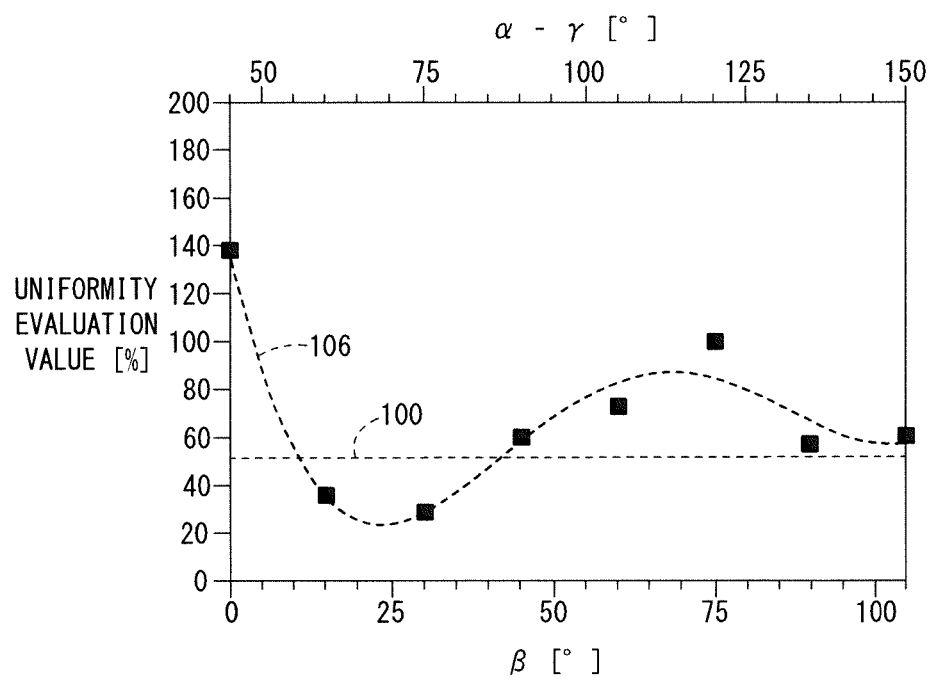
FIG. 7 is a graph showing experimental results of an Example 4.

According to Example 4, in a state in which the spraying direction of the nozzle 54 is inclined at 135° with respect to the substrate P (α−β=135°), and the exhaust direction of the exhaust unit 60 is perpendicular with respect to the horizontal plane (γ=90°), the film thickness uniformity was evaluated when the angle of inclination β of the substrate P was varied from 0° to 105°. Experimental results thereof are shown in FIG. 7. According to Example 4, other various conditions thereof apart from the spraying angle α of the nozzle 54 and the angle of inclination β of the substrate P, for example, conditions such as the material of the substrate P, the type of liquid, the method by which the mist is generated, the type and flow rate of the carrier gas, and the exhaust direction γ of the exhaust unit 60, etc., are the same as in Example 2. Further, the spray time of the mist was adjusted and film formation was carried out so as to form a thin film with a film thickness of 300 nm.

According to Example 4, because the spraying direction of the nozzle 54 is inclined at 135° with respect to the substrate P, and the exhaust direction of the exhaust unit 60 is perpendicular with respect to the horizontal plane, the angle of inclination β of the substrate P becomes 45° smaller in comparison with the angular difference (α−γ) between the spraying direction of the nozzle 54 and the exhaust direction of the exhaust unit 60. In other words, β+45=α−γ. In line 100 in FIG. 7, a reference value (51.3%) is indicated as described by Example 2. Further, the plural square shaped black dots shown in FIG. 7 represent evaluation values of the film thickness uniformity obtained at a plurality of angles of inclination β, and a curved line 106 is an approximation curve determined from the plurality of square shaped black dots. Moreover, the method for calculating the evaluation value for the film thickness uniformity in Example 4 is the same as that used in Example 1.

From the graph showing experimental results of FIG. 7, it could be confirmed that if the angle of inclination β of the substrate P is greater than or equal to 10° and less than or equal to 45°, or in other words, if the angular difference (α−γ) is greater than or equal to 55° and less than or equal to 90°, an evaluation result is obtained, which is substantially equivalent to or lower than the reference value (51.3%). More specifically, if the angle of inclination β of the substrate P lies within a range of 10° to 45°, and with the nozzle 54 and the exhaust unit 60 of the film forming apparatus 20 being at the reference posture, film thickness uniformity is obtained, which is substantially the same or superior to a condition in which the substrate P is not inclined. The reason therefore is due to the fact that, in the case that the angle of inclination β of the substrate P lies within a range of 10° to 45°, the time at which the sprayed mist resides on the surface side or in the vicinity of the film forming surface of the substrate P becomes longer. In addition, furthermore, by the exhaust action performed by the exhaust unit 60, the time at which the sprayed mist resides on the surface side or in the vicinity of the film forming surface of the substrate P becomes longer. Owing thereto, the film thickness uniformity can be further improved.

Preferably, the angle of inclination β of the substrate P is greater than or equal to 13° and less than or equal to 35°, or stated otherwise, the angular difference (α–γ) lies within a range of being greater than or equal to 58° and less than or equal to 80°. Accordingly, the obtained evaluation value of the uniformity can be made substantially less than or equal to 40%. Further, even more preferably, if the angle of inclination β of the substrate P lies within a range of 17° to 30°, or stated otherwise, if the angular difference (α–γ) lies within a range of 62° to 75°, the evaluation value of the film thickness uniformity becomes less than or equal to 30%. Consequently, further superior film thickness uniformity can be obtained.

Example 5

Figure 8:
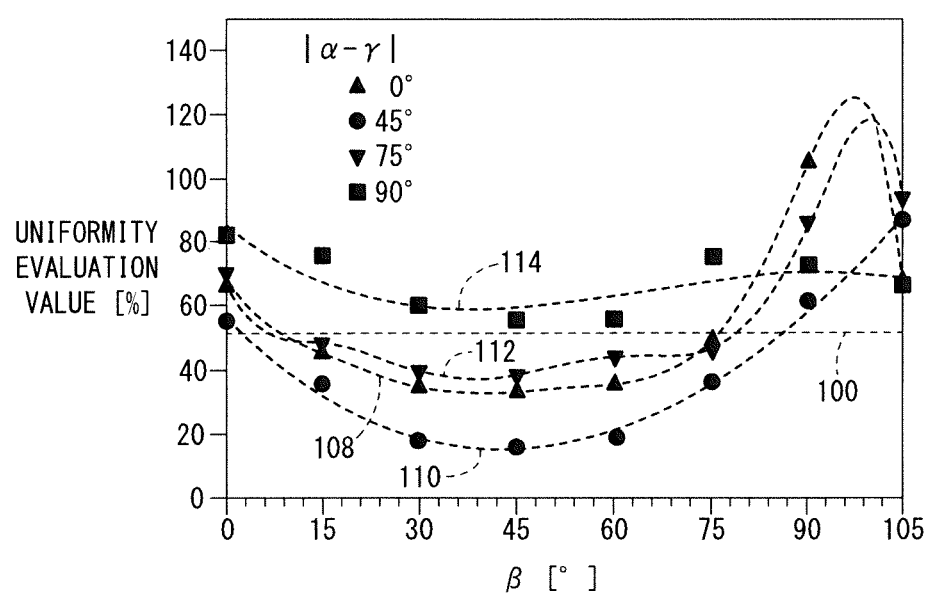
FIG. 8 is a graph showing experimental results of an Example 5.

According to Example 5, in a state in which the angular difference |α–γ| (where | | indicates absolute value) between the spraying direction of the nozzle 54 and the exhaust direction of the exhaust unit 60 was fixed at 0°, 45°, 75°, and 90°, respectively, the film thickness uniformity was evaluated when the angle of inclination β of the substrate P was varied from 0° to 105°. Experimental results thereof are shown in FIG. 8. According to Example 5, other various conditions thereof apart from the spraying angle α of the nozzle 54, the angle of inclination β of the substrate P, and the exhaust angle γ of the exhaust unit 60, for example, the material of the substrate P, the type of liquid, the method by which the mist is generated, the type and flow rate of the carrier gas, etc., are the same as in Example 2.

In line 100 in FIG. 8, a reference value (51.3%) is indicated as described by Example 2. The plural triangular (Δ) black dots shown in FIG. 8 represent evaluation values of the film thickness uniformity obtained at a plurality of angles of inclination β in a state in which the angular difference |α–γ| is 0°, and a curved line 108 is an approximation curve determined from the plurality of triangular black dots. The plural circular black dots shown in FIG. 8 represent evaluation values of the film thickness uniformity obtained at a plurality of angles of inclination β in a state in which the angular difference |α–γ| is 45°, and a curved line 110 is an approximation curve determined from the plurality of circular black dots. The plural reverse triangular (∇) black dots shown in FIG. 8 represent evaluation values of the film thickness uniformity obtained at a plurality of angles of inclination β in a state in which the angular difference |α–γ| is 75°, and a curved line 112 is an approximation curve determined from the plurality of reverse triangular black dots. The square shaped black dots shown in FIG. 8 represent evaluation values of the film thickness uniformity obtained at a plurality of angles of inclination β in a state in which the angular difference |α–γ| is 90°, and a curved line 114 is an approximation curve determined from the plurality of square shaped black dots. Moreover, the method for calculating the evaluation value for the film thickness uniformity in Example 5 is the same as that used in Example 1.

From the graph showing experimental results of FIG. 8, it could be confirmed that if the angular difference |α–γ| between the spraying direction of the nozzle 54 and the exhaust direction of the exhaust unit 60 exceeds 90°, irrespective of the angle of inclination β of the substrate P, the evaluation value of film thickness uniformity becomes greater than the reference value (51.3%). More specifically, when the angular difference |α–γ| exceeds 90°, irrespective of the angle of inclination β of the substrate P, the film thickness uniformity becomes more inferior than when the substrate P is in a non-inclined condition, with the nozzle 54 and the exhaust unit 60 of the film forming apparatus 20 being at the reference posture.

Further, it could be confirmed that, if at least the angular difference |α–γ| between the spraying direction of the nozzle 54 and the exhaust direction of the exhaust unit 60 is less than or equal to 75°, assuming a condition in which the angle of inclination β of the substrate P lies within a constant angular range (at least greater than or equal to 15° and less than or equal to 75°), an evaluation result is obtained, which is substantially equivalent to or lower than the reference value (51.3%). More specifically, with the angular difference |α–γ| being less than or equal to 75°, and in the case that the angle of inclination β of the substrate P lies within the constant angular range, since the time at which the sprayed mist resides on the surface side or in the vicinity of the film forming surface of the substrate P becomes longer, with the nozzle 54 and the exhaust unit 60 of the film forming apparatus 20 being at the reference posture, film thickness uniformity is obtained, which is substantially the same or superior to a condition in which the substrate P is not inclined. Consequently, in the case that at least the angular difference |α–γ| between the spraying direction of the nozzle 54 and the exhaust direction of the exhaust unit 60 is less than or equal to 75°, by the film forming apparatus 20 forming the thin film on the substrate P, which is conveyed while being inclined within a range of 15° to 75° with respect to the horizontal plane, further superior film thickness uniformity can be obtained.

Moreover, if at least the angular difference |α–γ| is 75° or less, and the angle of inclination β of the substrate P lies within a constant angular range (i.e., at least within a range of 15° to 75°), the fact that an evaluation value is obtained that is equal to or lower than the reference value (51.3%) can be confirmed as well from the graphs of the experimental results of FIGS. 5 through 7, as indicated by Example 2 through Example 4.

Example 6

Figure 9:
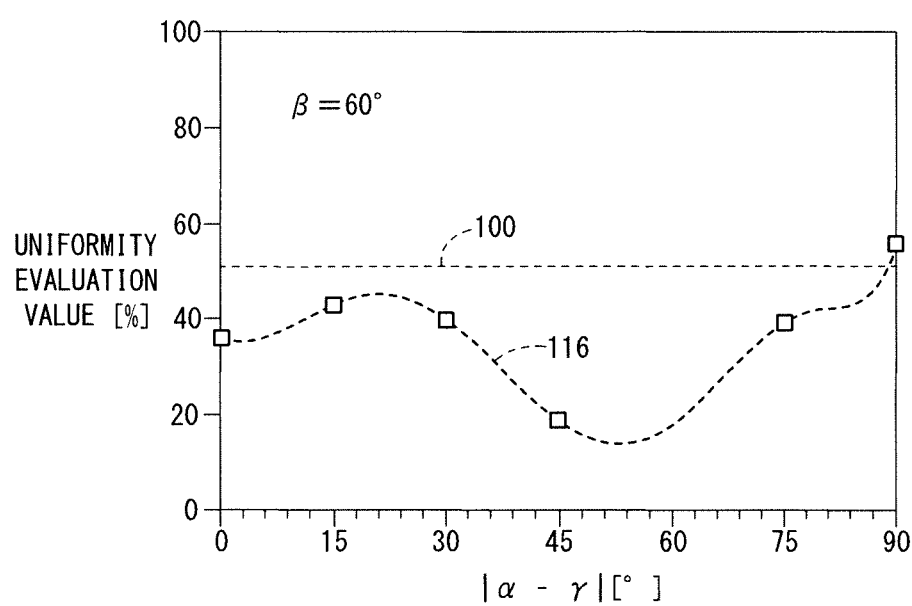
FIG. 9 is a graph showing experimental results of an Example 6.

According to Example 6, in a state in which the experimental results of Example 5 are taken into account, and the angle of inclination β of the substrate P is fixed at 60°, the film thickness uniformity was evaluated when the angular difference |α–γ| between the spraying direction of the nozzle 54 and the exhaust direction of the exhaust unit 60 was changed from 0° to 90°. Experimental results thereof are shown in FIG. 9. According to Example 6, other various conditions thereof apart from the spraying angle α of the nozzle 54, the angle of inclination β of the substrate P, and the exhaust angle γ of the exhaust unit 60, for example, the material of the substrate P, the type of liquid, the method by which the mist is generated, and the type and flow rate of the carrier gas, etc., are the same as in Example 2.

In line 100 in FIG. 9, a reference value (51.3%) is indicated as described by Example 2. Further, the plural square shaped white dots (□) shown in FIG. 9 represent evaluation values of the film thickness uniformity obtained at a plurality of angular differences |α−γ|, and a curved line 116 is an approximation curve determined from the plurality of square shaped white dots. Moreover, the method for calculating the evaluation value for the film thickness uniformity in Example 6 is the same as that used in Example 1.

From the graph showing experimental results of FIG. 9, it could be confirmed that if at least the angular difference |α−γ| is less than or equal to 75° when the angle of inclination β of the substrate P is 60°, which lies within the range of 15° to 75°, an evaluation result is obtained, which is substantially equivalent to or lower than the reference value (51.3%).

Third Embodiment

According to the third embodiment, by disposing at least a plurality of nozzles 54 along the direction of conveyance S of the substrate P, the film formation speed is improved. In the third embodiment, unless noted otherwise, the configuration of the substrate processing apparatus 12 including the film forming apparatus 20 is the same as that of the aforementioned first embodiment.

Figure 10:
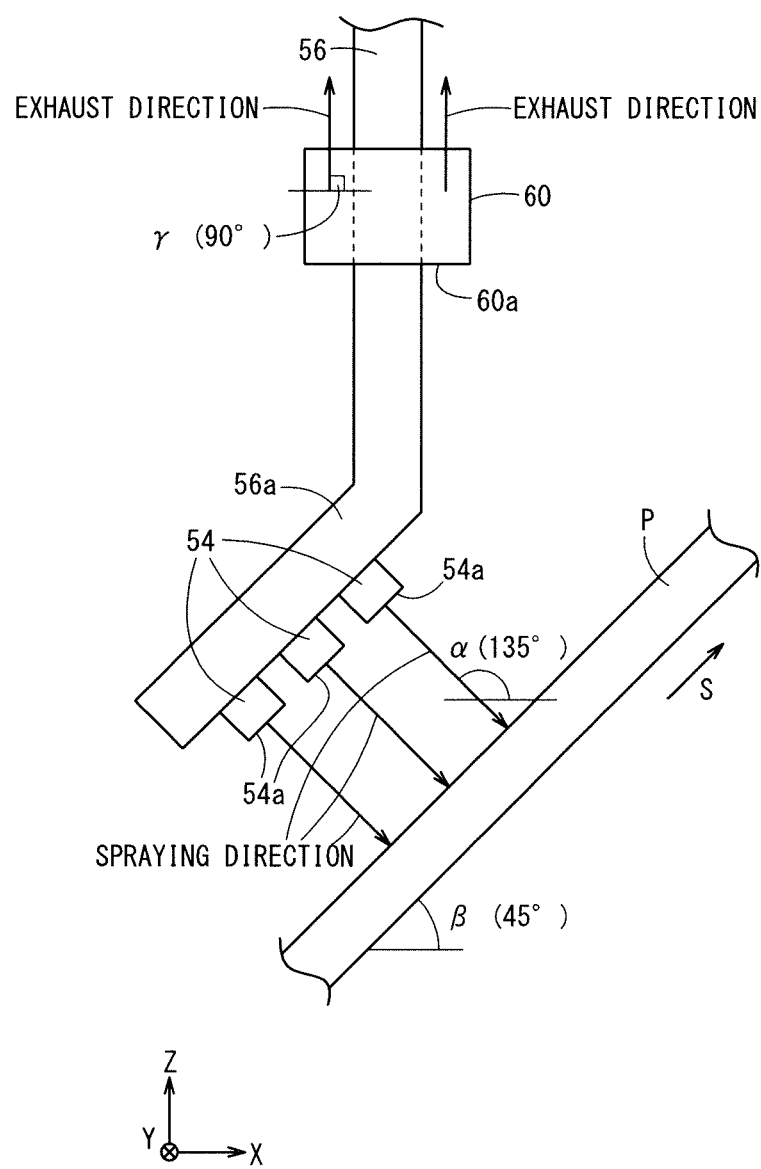
FIG. 10 is a view showing a configuration for arrangement of a nozzle, a supply pipe, an exhaust unit, and a substrate according to a third embodiment and an Example 7.

FIG. 10 is a view showing a configuration for arrangement of the nozzles 54, a supply pipe 56, an exhaust unit 60, and a substrate P according to the third embodiment. In FIG. 10 as well, illustration of the film forming chamber 50 is omitted. In the third embodiment, in the direction of conveyance S of the substrate P, the substrate P is inclined with respect to the horizontal plane, and plural nozzles 54 are arranged along the direction of conveyance S of the inclined substrate P. More specifically, the angle of inclination β of the substrate P is set at 45°, which lies within the range of 15° to 75°, and three nozzles 54 are arranged along the direction of conveyance S of the inclined substrate P.

The spraying direction of the nozzles 54 is perpendicular with respect to the substrate P, or stated otherwise, the spraying direction α of the nozzles 54 is 135°, whereas the discharge angle γ of the exhaust unit 60 is 90°. Accordingly, the angular difference |α−γ| between the spraying direction of the nozzles 54 and the exhaust direction of the exhaust unit 60 becomes 45°, which is less than or equal to 75°. More specifically, according to the present third embodiment, the mist is sprayed in the direction of the arrows, which is indicative of the spraying direction in FIG. 10. Further, the gas is exhausted in the directions of the arrows, which are indicative of the exhaust direction in FIG. 10.

The axial center of the exhaust unit 60 is disposed in a perpendicular manner with respect to the horizontal plane. The axial center of the supply pipe 56 penetrates through the interior of the exhaust unit 60 perpendicularly with respect to the horizontal plane, and thereafter, an extension 56a of the supply pipe 56 extends toward an upstream side of the substrate P in parallel with the surface of the substrate P. The three nozzles 54 are disposed along the extension 56a in parallel with the surface of the substrate P, and so that the spraying direction thereof is perpendicular with respect to the substrate P. Moreover, at least the exhaust port 60a of the exhaust unit 60, the extension 56a, and the nozzles 54 are disposed in the interior of the film forming chamber 50.

EXAMPLES

Example 7

In Example 7, the positional relationship between the nozzles 54, the supply pipe 56, the exhaust unit 60, and the substrate P is as shown in FIG. 10. According to Example 7, other various conditions thereof apart from the number of nozzles 54 and the spraying angle α and the angle of inclination β, for example, conditions such as the material of the substrate P, the type of liquid, the method by which the mist is generated, the type and flow rate of the carrier gas, and the exhaust direction γ, etc., are the same as in Example 1. Under these conditions, the mist was sprayed for two minutes from the nozzles 54, and the obtained film thickness was 300 nm.

With respect to the thin film having a formed area of 2 cm (in the transverse direction of the substrate P)×10 cm (in the direction of conveyance S of the substrate P), the resistance thereof was measured using a two-terminal method, whereby the film thickness uniformity was evaluated. The evaluation value for the film thickness uniformity was 18%, with the result that the uniformity dramatically improved in comparison with that of Example 1 (uniformity evaluation value 52%). Further, it was confirmed that the speed at which the film was formed was 150 nm/min, with the result that the film formation speed was higher in comparison with that of the aforementioned Example 1 (60 nm/min). Moreover, the method for calculating the evaluation value for the film thickness uniformity in Example 7 is the same as that used in Example 1.

Comparative Example 2

Figure 11:
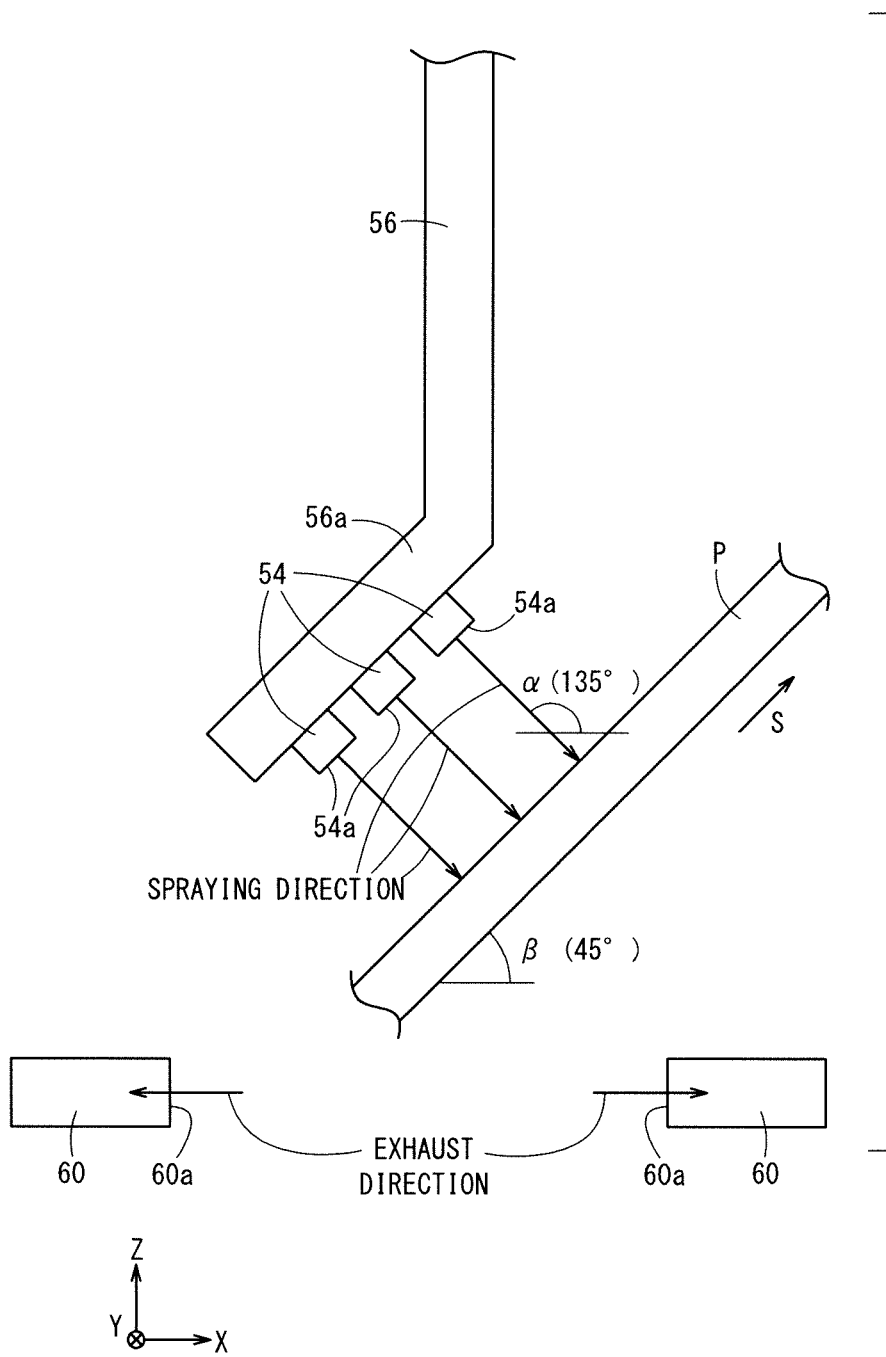
FIG. 11 is a view showing a positional relationship between a nozzle, a supply pipe, an exhaust unit, and a substrate according to a Comparative Example 2.

FIG. 11 is a view showing a positional relationship between the nozzles 54, the supply pipe 56, the exhaust unit 60, and the substrate P according to a Comparative Example 2. In Comparative Example 2, in a manner different from Example 7, exhaust units 60 are arranged more on the −Z direction side than the substrate P, and are arranged respectively on an upstream side and a downstream side in the direction of conveyance S of the substrate P. Other various conditions thereof, for example, conditions such as the type of liquid, the method by which the mist is generated, the type and flow rate of the carrier gas, the number and spraying direction α of the nozzles 54, and the material and angle of inclination β of the substrate P, etc., are the same as in Example 7. Under these conditions, the spray time of the mist was adjusted and film formation was carried out so as to form a thin film with a film thickness of 300 nm. In FIG. 11 as well, illustration of the film forming chamber 50 is omitted. Further, according to the present Comparative Example 2, the mist is sprayed in the direction of the arrows, which are indicative of the spraying direction in FIG. 11. Further, the gas is exhausted in the directions of the arrows, which are indicative of the exhaust direction in FIG. 11.

With respect to the thin film having a formed area of 2 cm (in the transverse direction of the substrate P)×10 cm (in the direction of conveyance S of the substrate P), the resistance thereof was measured using a two-terminal method, whereby the film thickness uniformity was evaluated. The evaluation value for the film thickness uniformity was 130%, with the result that the film thickness uniformity was inferior in comparison with that of Example 1 (uniformity evaluation value 52%) and Example 7 (uniformity evaluation value 18%). Further, the speed at which the film was formed was 30 nm/min, with the result that the film formation speed was slower in comparison with that of Example 7 (150 nm/min). The method for calculating the evaluation value for the film thickness uniformity in Comparative Example 2 is the same as that used in Example 1.

Further, even if the exhaust port 60a of the exhaust unit 60 is not arranged on a side that is opposite to the direction in which gravity acts with respect to the spraying port 54a of the nozzle 54, insofar as the exhaust port 60a of the exhaust unit 60 is arranged on a side that is opposite to the direction in which gravity acts with respect to the substrate P, since it is easier for the mist to reside on the upper side of the substrate P, film thickness uniformity is improved in comparison with Comparative Example 2.

Comparative Example 3

Figure 12:
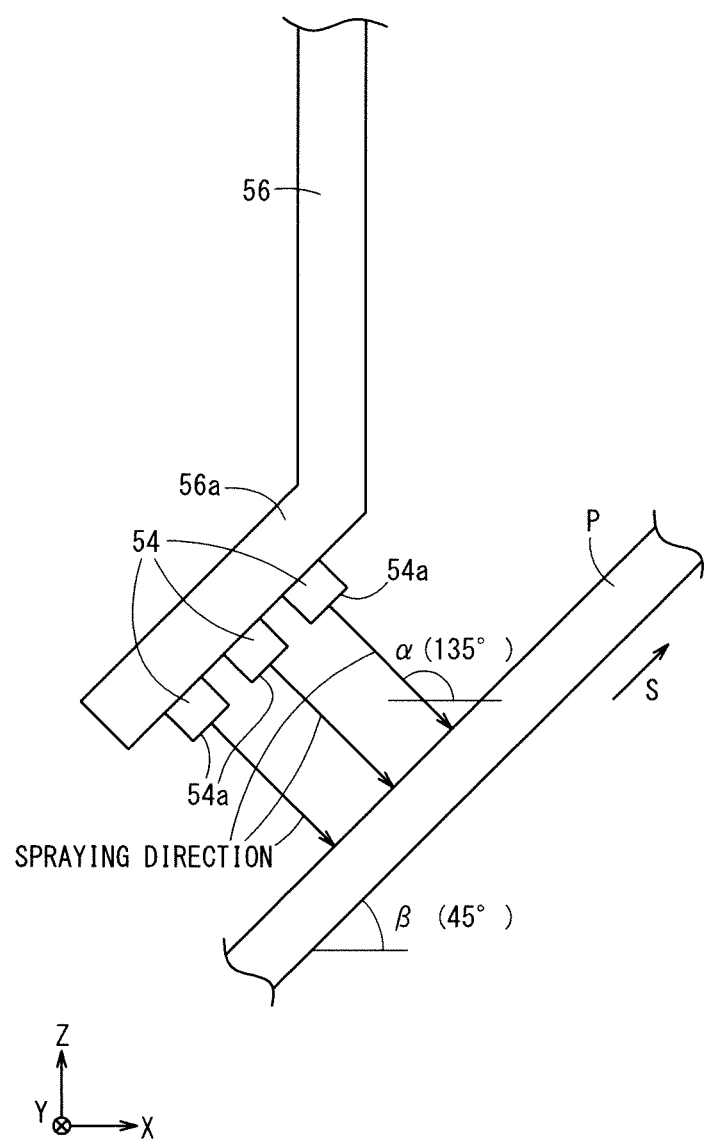
FIG. 12 is a view showing a positional relationship between a nozzle, a supply pipe, and a substrate according to a Comparative Example 3.

FIG. 12 is a view showing a positional relationship between the nozzles 54, the supply pipe 56, and the substrate P according to a Comparative Example 3. In Comparative Example 3, in a manner different from Example 7, the exhaust unit 60 is not provided. Further, in Comparative Example 3, the flow rate of the carrier gas was changed from 1 NL/min to 5 NL/min. Other various conditions thereof, for example, conditions such as the type of liquid, the method by which the mist is generated, the type of the carrier gas, the number and spraying direction α of the nozzles 54, and the material and angle of inclination β of the substrate P, etc., are the same as in Example 7. Under these conditions, at each of respective flow rates of the carrier gas, the spray time of the mist was adjusted and film formation was carried out so as to form a thin film with a film thickness of 300 nm. In FIG. 12 as well, illustration of the film forming chamber 50 is omitted. Further, according to the present Comparative Example 3, the mist is sprayed in the direction of the arrows, which are indicative of the spraying direction in FIG. 12.

As a result, with respect to the thin film having a formed area of 2 cm (in the transverse direction of the substrate P)×10 cm (in the direction of conveyance S of the substrate P), the resistance thereof was measured using a two-terminal method, whereby the film thickness uniformity was evaluated. Evaluation results for the film thickness uniformity are shown in FIG. 13. Moreover, the method for calculating the evaluation value for the film thickness uniformity in Comparative Example 3 is the same as that used in Example 1.

As shown in FIG. 13, in the case of a carrier gas flow rate of 1 NL/min, the film thickness uniformity evaluation value was 165%, and the film formation speed was 140 nm/min. In the case of a carrier gas flow rate of 2 NL/min, the film thickness uniformity evaluation value was 154%, and the film formation speed was 135 nm/min. In the case of a carrier gas flow rate of 3 NL/min, the film thickness uniformity evaluation value was 145%, and the film formation speed was 132 nm/min. Further, in the case of a carrier gas flow rate of 4 NL/min, the film thickness uniformity evaluation value was 140%, and the film formation speed was 130 nm/min. In the case of a carrier gas flow rate of 5 NL/min, the film thickness uniformity evaluation value was 120%, and the film formation speed was 130 nm/min.

From the above, it is most excellent when the carrier gas flow rate is 5 NL/min, and the film thickness uniformity evaluation value is 120%. However, even if the film thickness uniformity is most excellent in this manner, the result was that the film thickness uniformity is inferior in comparison with that of Example 1 (uniformity evaluation value 52%) and Example 7 (uniformity evaluation value 18%). Further, when the flow rate of the carrier gas was 4 NL/min or 5 NL/min, a result occurred in which, although the film formation speed is most rapid when the film formation speed is 130 nm/min, the film formation speed is slower in comparison with that of Example 7 (150 nm/min).

As reason for the improvement in the film thickness uniformity of Example 7 in contrast to Comparative Examples 2 and 3, as was described above with the first embodiment, it is due to the fact that the exhaust port 60a of the exhaust unit 60 is disposed on a side that is opposite to the direction of gravity with respect to the spraying port 54a of the nozzle 54. Further as reason for the improvement in the film thickness uniformity of Example 7 in contrast to the aforementioned Example 1, as was described above with the second embodiment, it is due to the fact that the substrate P is inclined within the range of 15° to 75°, and the angular difference |α−γ| between the spraying direction of the nozzles 54 and the exhaust direction of the exhaust unit 60 is less than or equal to 75°.

Modification 1

In Modification 1, concerning the positional relationship between the nozzles 54, the supply pipe 56, the exhaust unit 60, and the substrate P shown in FIG. 10, a case will be described in which film formation is carried out using a liquid (dispersion liquid) in which fine particles of $SiO_2$ as the film forming material are dispersed in an IPA dispersion medium. In Modification 1, other various conditions thereof apart from the type of liquid, for example, the method by which the mist is generated, the type and flow rate of the carrier gas, the number and spraying direction α of the nozzles 54, the material and angle of inclination β of the substrate P, and the exhaust direction γ of the exhaust unit 60, etc., are the same as in Example 7. Under these conditions, the mist was sprayed for five minutes from the nozzles 54, and the obtained film thickness was 300 nm. According to Modification 1, a film of $SiO_2$ was formed on a film of ZnO:Al (zinc oxide to which aluminum was added) that was formed on the substrate P.

Within the formed $SiO_2$ thin film, with respect to an area of 2 cm (in the transverse direction of the substrate P)×10 cm (in the direction of conveyance S of the substrate P), the film thickness was measured directly using a stylus type film thickness meter, and the film thickness uniformity was evaluated. Concerning measurement of the film thickness, such a measurement was performed at each of 2 cm intervals along the transverse direction and the direction of conveyance S of the substrate P. An evaluation value for the film thickness uniformity was 15%. The evaluation value for the film thickness uniformity is indicative of the fact that the film thickness becomes more uniform the lower such a value is. Further, the speed at which the film was formed was 60 nm/min.

In Modification 1, the evaluation value for the film thickness uniformity was calculated using the following formula:

$$\text{Evaluation Value of Film Thickness Uniformity} = (T_{max} - T_{min})/T_{min} \times 100 \qquad (2)$$

where $T_{max}$ indicates a maximum value of the film thickness, and $T_{min}$ indicates a minimum value of the film thickness. Stated otherwise, the calculation is carried out in accordance with the highest film thickness value $T_{max}$ and the lowest film thickness value $T_{min}$, from among the plural film thicknesses that were measured with respect to the thin film of 2 cm×10 cm.

Figure 14:
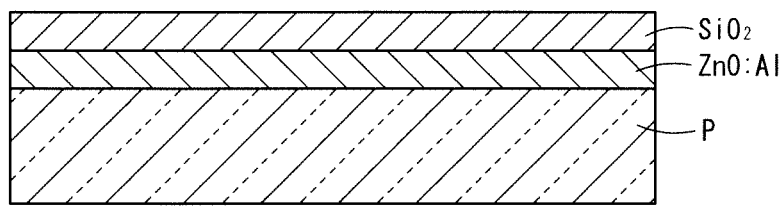
FIG. 14 is a view showing the structure of a device obtained by forming a thin film of $SiO_2$ on a film of $ZnO:Al$ that is formed on a substrate, according to a Modification 1.

In FIG. 14, a structure of the device is shown, which is obtained by forming a thin film of $SiO_2$ on a film of ZnO:Al (zinc oxide to which aluminum was added) that is formed on the substrate P. The carrier density of the ZnO:Al film is $8\times10^{19}/cm^3$. In addition, the device (the substrate P on which the $SiO_2$ thin film was formed) was fired in a 300° air atmosphere for one hour. Carrier generation of ZnO:Al is caused at least by electrons which are generated by oxygen vacancies, and defects are compensated for by exposure to an oxidizing atmosphere, whereby the carrier density is reduced. However, since the $SiO_2$ film was formed on the ZnO:Al film, the carrier density of the ZnO:Al film after firing becomes $6.8\times10^{19}/cm^3$, which is a value that is not changed much from the carrier density before firing. Accordingly, it could be confirmed that the formed thin film of $SiO_2$ exhibited an effect as an oxygen barrier layer.

In the foregoing manner, according to the embodiments of the present invention, since the exhaust port 60a of the exhaust unit 60 of the film forming apparatus 20 is arranged on a side that is opposite to the direction in which gravity acts with respect to the spraying port 54a of the nozzle 54, it becomes easy for the thin film material to reside on the surface side or in the vicinity of the film forming surface of the substrate P, and the film thickness uniformity of the thin film to be formed on the substrate P can be improved.

Since the film forming apparatus 20 forms the thin film with respect to the substrate P, which is inclined within a range of 15° to 75° with respect to a horizontal plane that is perpendicular to the direction in which gravity acts, and the angular difference $|\alpha-\gamma|$ between the spraying direction of the nozzle 54 and the exhaust direction of the exhaust unit 60 is less than or equal to 75°, the time at which the film forming material resides on the surface side or in the vicinity of the film forming surface of the substrate P can further be lengthened, and the uniformity of the thin film to be formed can be further improved.

Because the exhaust port 60a is disposed on the supply pipe 56 at a position that is separated from the spraying ports 54a of the nozzles 54, it is unlikely for the sprayed thin film material to be exhausted from the exhaust port 60a. Consequently, it becomes easy for the thin film material to reside on the surface side or in the vicinity of the film forming surface of the substrate P, and the film thickness uniformity of the thin film to be formed on the substrate P can be improved. Further, because at least the nozzles 54 are arranged in plurality along the direction of conveyance S of the substrate P, the film formation speed can be made faster.

According to the first through third embodiments, although the film forming apparatus 20 carries out the film forming process for forming the thin film with respect to the substrate P while it is being conveyed, film formation may also be performed with respect to a stationary substrate P. Since the exhaust port 60a of the exhaust unit 60 of the film forming apparatus 20 is arranged on a side that is opposite to the direction in which gravity acts with respect to the spraying port 54a of the nozzle 54, even if film formation is performed with respect to a stationary substrate P, the film thickness uniformity of the thin film to be formed on the substrate P can be improved.

While the invention has been particularly shown and described with reference to preferred embodiments, it will be understood that variations and modifications can be effected thereto by those skilled in the art without departing from the scope of the invention as defined by the appended claims.

What is claimed is:

1. A film forming apparatus comprising:
    a film forming chamber;
    a mist supplier configured to atomize a liquid including a thin film material;
    a substrate conveyor configured to convey a flexible substrate into the film forming chamber;
    a sprayer port provided in the film forming chamber, the sprayer port configured to spray a gas including the liquid which has been atomized onto the flexible substrate from inside of the film forming chamber and above the flexible substrate, the flexible substrate inclined in the film forming chamber with respect to a horizontal plane, said horizontal plane being perpendicular to a direction of gravitational force; and
    an exhaust port provided above the flexible substrate and configured to exhaust the gas including the liquid which has been atomized from the film forming chamber, wherein:
        the substrate conveyor conveys the flexible substrate with the flexible substrate inclined within a range of 30° to 60° with respect to the horizontal plane perpendicular to the direction of gravitational force inside the film forming chamber,
        an angular difference between a spraying direction of the sprayer port and an exhaust direction of the exhaust port is less than or equal to 75°, and
        the sprayer port is configured to spray the gas including the atomized liquid onto the flexible substrate, the sprayer port is arranged directly above the portion of the flexible substrate being conveyed in an inclined direction within the range of 30° to 60°.

2. The film forming apparatus according to claim 1, wherein
    the sprayer port is one among a plurality of sprayer ports included in the film forming apparatus, and
    the plurality of sprayer ports are arranged along a direction in which the flexible substrate is conveyed.

3. A substrate processing apparatus comprising:
    the film forming apparatus according to claim 1; and
    an exposure device configured to form a predetermined pattern on the flexible substrate by illuminating the flexible substrate, on which the thin film is formed by the film forming apparatus, with a light.

4. A device manufacturing method for manufacturing a device, comprising:
    forming a thin film on the flexible substrate, using the film forming apparatus according to claim 1; and
    forming a predetermined pattern on the flexible substrate by illuminating the flexible substrate, on which the thin film is formed by the forming the thin film, with a light.

5. The film forming apparatus according to claim 1, wherein the gas including the liquid which has been atomized is sprayed onto the flexible substrate while the flexible substrate is being conveyed.

6. The film forming apparatus according to claim 1, wherein the thin film material comprises fine metal particles or metal oxide.

7. The film forming apparatus according to claim 1, wherein the flexible substrate is formed of a resin.

8. The film forming apparatus according to claim 1, wherein the mist supplier atomizes the liquid using an ultrasonic vibrator.

9. The device manufacturing method according to claim 4, wherein
  the sprayer port is one among a plurality of sprayer ports included in the film forming apparatus, and
  the plurality of sprayer ports are arranged along a direction in which the flexible substrate is conveyed.

10. The device manufacturing method according to claim 4, wherein the substrate conveyor conveys the flexible substrate in the film forming chamber in a manner that the flexible substrate is inclined with respect to the horizontal plane perpendicular to the direction of gravitational force.

11. The device manufacturing method according to claim 4, wherein the flexible substrate is conveyed in a state in which the flexible substrate is inclined within a range of 15° to 75° with respect to the horizontal plane perpendicular to the direction of gravitational force.

12. The device manufacturing method according to claim 11, wherein the angular difference between a spraying direction of the sprayer port and an exhaust direction of the exhaust port is less than or equal to 75°.

* * * * *